(12) United States Patent
Wyrzykowska et al.

(10) Patent No.: US 7,069,650 B2
(45) Date of Patent: Jul. 4, 2006

(54) METHOD FOR REDUCING THE NUMBER OF LAYERS IN A MULTILAYER SIGNAL ROUTING DEVICE

(75) Inventors: Aneta Wyrzykowska, Kanata (CA); Herman Kwong, Kanata (CA); Guy A. Duxbury, Nepean (CA); Luigi G. Difilippo, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 558 days.

(21) Appl. No.: 10/326,123

(22) Filed: Dec. 23, 2002

(65) Prior Publication Data

US 2004/0016117 A1 Jan. 29, 2004

Related U.S. Application Data

(63) Continuation-in-part of application No. 10/126,700, filed on Apr. 22, 2002, now Pat. No. 6,545,876, which is a continuation of application No. 09/651,188, filed on Aug. 30, 2000, now Pat. No. 6,388,890, which is a continuation-in-part of application No. 10/101,211, filed on Mar. 20, 2002, which is a continuation-in-part of application No. 09/651,188, filed on Aug. 30, 2000, now Pat. No. 6,388,890.

(60) Provisional application No. 60/212,387, filed on Jun. 19, 2000.

(51) Int. Cl.
*H05K 3/02* (2006.01)
*H05K 7/02* (2006.01)

(52) U.S. Cl. .......................... 29/846; 29/830; 29/831; 29/593; 29/852; 361/780

(58) Field of Classification Search ................ 29/852, 29/846, 593, 830, 831; 438/125; 174/255, 174/262; 361/780, 794
See application file for complete search history.

(56) References Cited

U.S. PATENT DOCUMENTS

| 3,300,686 A | * | 1/1967 | McConnell et al. | ......... 361/787 |
| 4,514,786 A | * | 4/1985 | Charruau | ..................... 361/791 |
| 5,144,746 A | * | 9/1992 | McDavid | ..................... 29/830 |

(Continued)

FOREIGN PATENT DOCUMENTS

EP       1087440 A2    3/2001

(Continued)

OTHER PUBLICATIONS

European Search Report dated Jun. 8, 2004 for Application No. EP 03 39 4085.

(Continued)

*Primary Examiner*—A. Dexter Tugbang
*Assistant Examiner*—Tai Nguyen
(74) *Attorney, Agent, or Firm*—Hunton & Williams LLP

(57) ABSTRACT

A technique for reducing the number of layers in a multilayer signal routing device is disclosed. In one particular exemplary embodiment, the technique may be realized as a method for reducing the number of layers in a multilayer signal routing device having a plurality of electrically conductive signal path layers for routing electrical signals to and from at least one electronic component mounted on a surface of the multilayer signal routing device. In such a case, the method comprises routing electrical signals on the plurality of electrically conductive signal path layers in the multilayer signal routing device for connection to and from a high density electrically conductive contact array package based at least in part upon at least one of an electrically conductive contact signal type characteristic and an electrically conductive contact signal direction characteristic.

30 Claims, 19 Drawing Sheets

U.S. PATENT DOCUMENTS

| | | | |
|---|---|---|---|
| 5,218,172 A * | 6/1993 | Seidel | 174/268 |
| 5,281,151 A * | 1/1994 | Arima et al. | 439/68 |
| 5,451,721 A | 9/1995 | Tsukada et al. | |
| 5,686,764 A * | 11/1997 | Fulcher | 257/778 |
| 5,784,262 A | 7/1998 | Sherman | |
| 5,847,936 A | 12/1998 | Forehand et al. | |
| 6,181,004 B1 | 1/2001 | Koontz et al. | |
| 6,198,635 B1 | 3/2001 | Shenoy et al. | |
| 6,232,564 B1 | 5/2001 | Arndt et al. | |
| 6,256,769 B1 | 7/2001 | Tamarkin et al. | |
| 6,388,890 B1 | 5/2002 | Kwong et al. | |
| 6,521,846 B1 | 2/2003 | Freda et al. | |
| 2003/0043560 A1 | 3/2003 | Clarkson et al. | |

FOREIGN PATENT DOCUMENTS

FR     2782230 A1     2/2000

OTHER PUBLICATIONS

European Search Report dated Jun. 8, 2004 for Application No. EP 03 39 4028.

* cited by examiner

METHOD FOR REDUCING THE NUMBER OF LAYERS IN A MULTILAYER SIGNAL ROUTING DEVICE

CROSS-REFERENCE TO RELATED APPLICATIONS

This patent application is a continuation-in-part patent application of U.S. patent application Ser. No. 10/126,700, filed Apr. 22, 2002, now U.S. Pat. No. 6,545,876 which is a continuation patent application of U.S. patent application Ser. No. 09/651,188, filed Aug. 30, 2000, now U.S. Pat. No. 6,388,890, which claims priority to U.S. Provisional Patent Application No. 60/212,387, filed Jun. 19, 2000, all of which are hereby incorporated by reference herein in their entirety.

This patent application is also a continuation-in-part patent application of U.S. patent application Ser. No. 10/101,211, filed Mar. 20, 2002, which is a continuation-in-part patent application of U.S. patent application Ser. No. 09/651,188, filed Aug. 30, 2000, now U.S. Pat. No. 6,388,890, which claims priority to U.S. Provisional Patent Application No. 60/212,387, filed Jun. 19, 2000, all of which are hereby incorporated by reference herein in their entirety.

FIELD OF THE INVENTION

The present invention relates generally to multilayer signal routing devices and, more particularly, to a technique for reducing the number of layers in a signal routing device.

BACKGROUND OF THE INVENTION

The making of electrical connections between electronic components has long been accomplished using printed circuit boards. The first such circuit boards had only a single signal layer on a top surface thereof for routing electrical signals between electronic components mounted thereon. These single signal layer circuit boards have severe limitations with regard to the number of electrical signals that can be routed between electronic components mounted on the same circuit board. That is, the number of electrical signals that can be routed between electronic components mounted on a single signal layer circuit board is limited by the amount of area on the single signal layer.

The area limitations associated with single signal layer circuit boards led to the development of multilayer printed circuit boards. Such multilayer printed circuit boards may be either single or double-sided and may have multiple signal layers on the surface of and buried within the multilayer printed circuit boards. Thus, such multilayer printed circuit boards have allowed a large increase in the number of electrical signals that may be routed between electronic components mounted on the same circuit board.

The use of multilayer printed circuit boards has been particularly beneficial when using electronic components having high density packages. That is, electronic components having high density packages generally require multiple layers of a multilayer printed circuit board to make electrical connections with other electronic components mounted on the same circuit board. In fact, the density of electronic component packages typically dictates the number of layers that must be provided by the multilayer printed circuit board upon which the electronic component is mounted. While the number of layers that may be provided by a multilayer printed circuit board is theoretically unlimited, problems occur when the number of layers in a multilayer printed circuit board exceeds a reasonable number, particularly when trying to route high speed electrical signals between electronic components. For example, when making electrical connections between different layers in multilayer printed circuit boards, electrically conductive vias are generally used. While these electrically conductive vias allow direct vertical electrical connections to be made between different layers within a multilayer printed circuit board, there are intrinsic parasitics associated with these electrically conductive vias that can adversely affect the performance of signals propagating therethrough. That is, these electrically conductive vias have intrinsic parasitic resistance, capacitance, and inductance, which can adversely affect signals propagating along each electrically conductive via. In addition, these intrinsic parasitics can also have an adverse effect on the manufacturability of a printed circuit board and thus the cost thereof. Because of their adverse affect on signal performance, these intrinsic parasitics can also limit the bandwidth of signals propagating along each electrically conductive via. These adverse affects only increase as the number of layers in a multilayer printed circuit board increase.

In view of the foregoing, it would be desirable to provide a technique for increasing the number of electrical connections that may be made between electronic components mounted on a multilayer printed circuit board without increasing the number of layers in the multilayer printed circuit board. More particularly, it would be desirable to provide a technique for reducing the number of layers in a multilayer signal routing device in an efficient and cost effective manner.

SUMMARY OF THE INVENTION

According to the present invention, a technique for reducing the number of layers in a multilayer signal routing device is provided. In one particular exemplary embodiment, the technique may be realized as a method for reducing the number of layers in a multilayer signal routing device having a plurality of electrically conductive signal path layers for routing electrical signals to and from at least one electronic component mounted on a surface of the multilayer signal routing device. In such a case, the method comprises receiving electronic component information including an electrically conductive contact count characteristic, an electrically conductive contact pitch characteristic, an electrically conductive contact signal type characteristic, and an electrically conductive contact signal direction characteristic for at least one electronic component. The method also comprises identifying an electronic component having a high density electrically conductive contact array package based at least in part upon at least one of the electrically conductive contact count characteristic and the electrically conductive contact pitch characteristic. The method further comprises routing electrical signals on the plurality of electrically conductive signal path layers in the multilayer signal routing device for connection to and from the high density electrically conductive contact array package based at least in part upon at least one of the electrically conductive contact signal type characteristic and the electrically conductive contact signal direction characteristic.

In accordance with other aspects of this particular exemplary embodiment of the present invention, the method may further beneficially comprise forming a plurality of electrically conductive vias in the multilayer signal routing device extending from the surface of the multilayer signal routing device to one of the plurality of electrically conductive signal path layers, wherein the plurality of electrically conductive vias are arranged so as to form a channel in another of the plurality of electrically conductive signal path layers beneath the plurality of electrically conductive vias. If such is the case, the channel may beneficially be configured to have a linear, circular, diamond, curved, stepped, staggered, or random shape, or a combination thereof. Also, the channel may beneficially be configured to be in a vertical, horizontal, diagonal, or random direction, or a combination thereof. Further, the plurality of electrically conductive vias may beneficially further extend from the surface of the multilayer signal routing device to different ones of the plurality of electrically conductive signal path layers.

The plurality of electrically conductive vias may beneficially form at least a portion of an electrically conductive contact array for mating with the high density electrically conductive contact array package of the electronic component, wherein at least a portion of the plurality of electrically conductive vias may beneficially be positioned inside the electrically conductive contact array such that the channel is correspondingly formed inside the electrically conductive contact array. Also, the multilayer signal routing device may beneficially have an array of electrically conductive contacts formed on the surface thereof for mating with the high density electrically conductive contact array package of the electronic component, wherein at least a portion of the plurality of electrically conductive vias may beneficially be formed outside the array of electrically conductive contacts, wherein each of the portion of the plurality of electrically conductive vias may beneficially be electrically connected to peripheral ones of the electrically conductive contacts on the surface the multilayer signal routing device.

The plurality of electrically conductive vias may beneficially form at least a portion of an electrically conductive contact array for mating with the high density electrically conductive contact array package of the electronic component, wherein at least a portion of the plurality of electrically conductive vias may beneficially be positioned within the electrically conductive contact array such that the channel extends across the electrically conductive contact array. Also, the plurality of electrically conductive vias may beneficially form at least a portion of an electrically conductive contact array for mating with the high density electrically conductive contact array package of the electronic component, wherein the electrically conductive contact array may beneficially have a square, triangular, circular, or random electrically conductive contact pattern, or a combination thereof. Further, at least two of the electrical signals may beneficially be differential electrical signals, wherein the differential electrical signals may beneficially be at least partially routed together in the channel formed in another of the plurality of electrically conductive signal path layers beneath the plurality of electrically conductive vias.

In accordance with further aspects of this particular exemplary embodiment of the present invention, the multilayer signal routing device may beneficially have at least one electrically conductive power layer for providing power to the electronic component mounted on the surface of the multilayer signal routing device. If such is the case, the method may further beneficially comprise forming a plurality of electrically conductive vias in the multilayer signal routing device extending from the surface of the multilayer signal routing device to at least one of the at least one electrically conductive power layer, wherein each of the plurality of electrically conductive vias may beneficially be electrically connected to at least one respective electrically conductive power contact on the surface of the multilayer signal routing device, and wherein each of the at least one electrically conductive power contact may beneficially form a portion of an electrically conductive contact array for mating with the high density electrically conductive contact array package of the electronic component. If such is the case, a channel may beneficially be formed in each of the plurality of electrically conductive signal path layers beneath the electrically conductive power contacts.

In accordance with still further aspects of this particular exemplary embodiment of the present invention, the multilayer signal routing device may beneficially have at least one electrically conductive ground layer for providing a ground reference to the electronic component mounted on the surface of the multilayer signal routing device. If such is the case, the method may further beneficially comprise forming a plurality of electrically conductive vias in the multilayer signal routing device extending from the surface of the multilayer signal routing device to at least one of the at least one electrically conductive ground layer, wherein each of the plurality of electrically conductive vias may beneficially be electrically connected to at least one respective electrically conductive ground contact on the surface of the multilayer signal routing device, wherein each of the at least one electrically conductive ground contact may beneficially form a portion of an electrically conductive contact array for mating with the high density electrically conductive contact array package of the electronic component. If such is the case, a channel may beneficially be formed in each of the plurality of electrically conductive signal path layers beneath the electrically conductive ground contacts.

In accordance with additional aspects of this particular exemplary embodiment of the present invention, the multilayer signal routing device may beneficially have at least one electrically conductive shared power/ground layer for providing power/ground to the electronic component mounted on the surface of the multilayer signal routing device. If such is the case, the method may further comprise forming a plurality of electrically conductive vias in the multilayer signal routing device extending from the surface of the multilayer signal routing device to at least one of the at least one electrically conductive shared power/ground layer, wherein each of the plurality of electrically conductive vias may beneficially be electrically connected to at least one respective electrically conductive power/ground contact on the surface of the multilayer signal routing device, wherein each of the at least one electrically conductive power/ground contact may beneficially form at least a portion of an electrically conductive contact array for mating with the high density electrically conductive contact array package of the electronic component. If such is the case, a channel may beneficially be formed in each of the plurality of electrically conductive signal path layers beneath each of the at least one electrically conductive power/ground contact.

In accordance with still additional aspects of this particular exemplary embodiment of the present invention, the surface of the multilayer signal routing device may beneficially be an inner surface of the multilayer signal routing device and the at least one electronic component may beneficially be mounted on the inner surface of the multilayer signal routing device. If such is the case, the at least one electronic component may beneficially have at least one first electrically conductive contact formed on a first side thereof, wherein the at least one first electrically conductive contact may beneficially be electrically connected to at least one first corresponding electrically conductive contact formed on the inner surface of the multilayer signal routing device. Optionally, the at least one electronic component may beneficially have at least one second electrically conductive contact formed on a second side thereof, wherein the at least one second electrically conductive contact may beneficially be electrically connected to at least one second corresponding electrically conductive contact formed on another inner surface of the multilayer signal routing device.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a more full understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1:
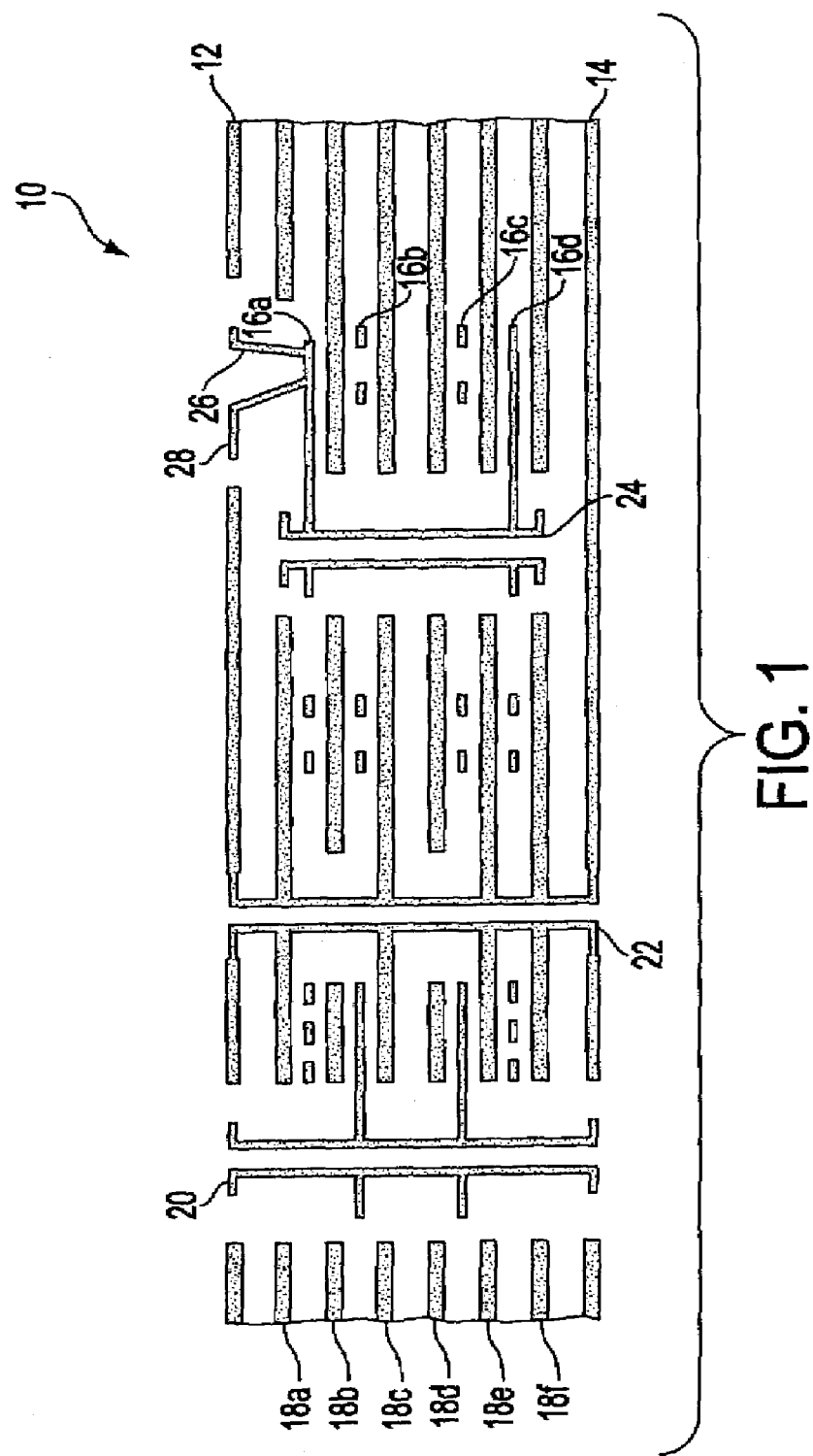
FIG. 1 is a side cross-sectional view of a multilayer printed circuit board in accordance with the present invention.

Referring to FIG. 1, there is shown a side cross-sectional view of a multilayer printed circuit board 10 in accordance with the present invention. That is, the multilayer printed circuit board 10 incorporates the concepts of the present invention so as to reduce the number of layers in the multilayer printed circuit board 10.

The multilayer printed circuit board 10 comprises a primary (top) layer 12, a secondary (bottom) layer 14, a plurality of signal layers 16, and a plurality of power/ground plane layers 18. It should be noted that the primary layer 12 and the secondary layer 14 are primarily power/ground plane layers except for contact pads and test signal runs formed thereon, as will be described in more detail below. It should also be noted that electronic components may be mounted on either (single-sided board) or both (double-sided board) the primary layer 12 and the secondary layer 14.

The multilayer printed circuit board 10 also comprises a first supervia 20 for electrically connecting selected ones of the plurality of signal layers 16 (i.e., signal layers 16b and 16c), a second supervia 22 for electrically connecting the primary layer 12, the secondary layer 14, and selected ones of the plurality of power/ground plane layers 18 (i.e., power/ground plane layers 18a, 18c, 18e, and 18f), a buried via 24 for electrically connecting selected ones of the plurality of signal layers 16 (i.e., signal layers 16a and 16d), and a microvia 26 for electrically connecting signal layer 16a to a contact pad 28 formed on the primary layer 12.

It should be noted that the buried via 24 and/or the microvia 26 may alternatively be used to electrically connect selected ones of the plurality of power/ground plane layers 18. It should also be noted that the microvia 26 could also be a via-in-pad, or some other similar non-through-hole via, that the microvia 26 may be formed on either or both the primary layer 12 and the secondary layer 14, and that the microvia 26 may be electrically connected to other microvias, supervias, buried vias, etc., either directly or through signal layer or power/ground plane layer electrical connections. It should further be noted that it is the microvia 26 (or substantial equivalent thereof) which allows a substantial portion of the present invention technique to be realized, as will now be described in more detail with reference to FIGS. 2–16, of which FIGS. 4–16 correspond to the twelve layers of the multilayer printed circuit board 10.

Figure 2:
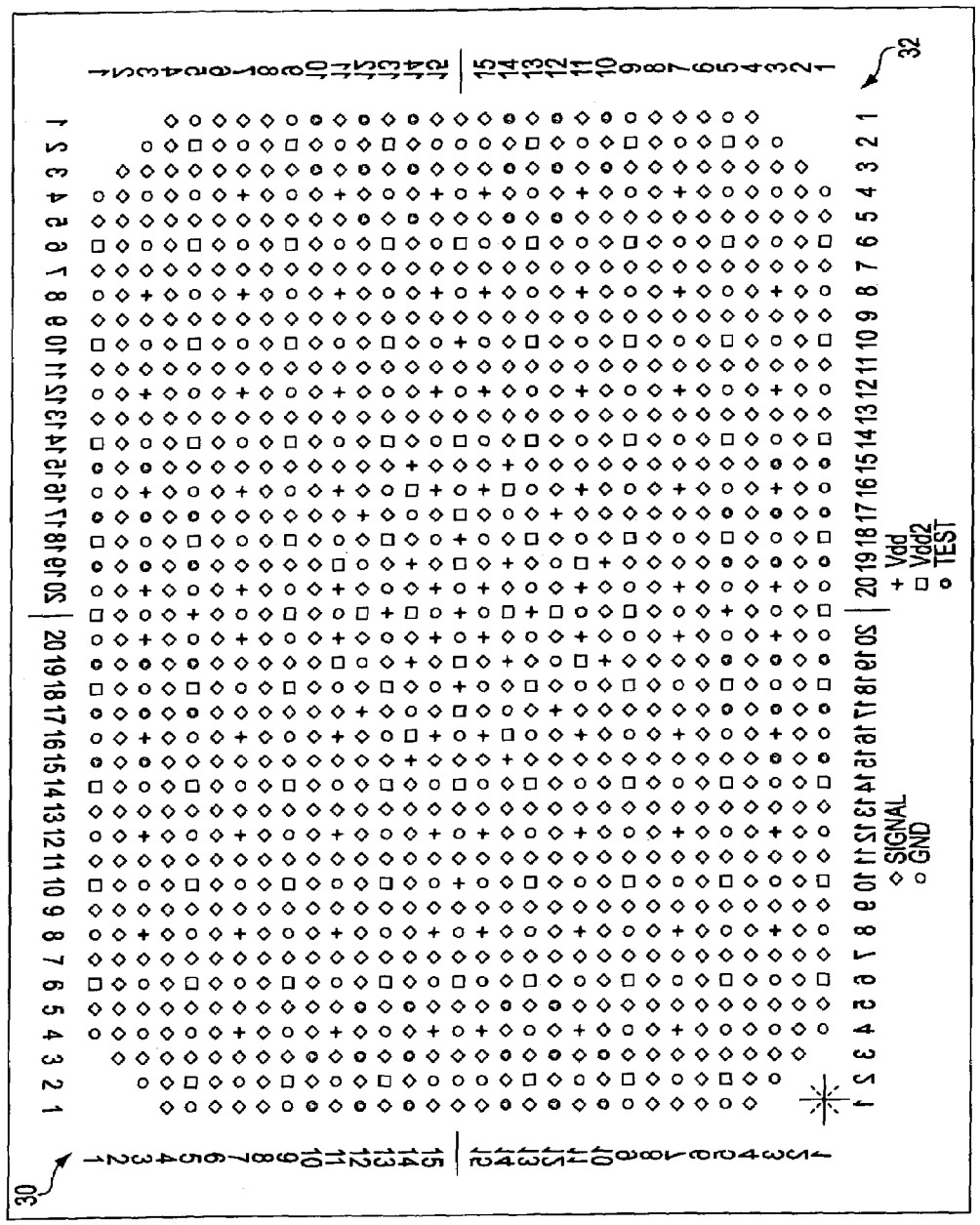
FIG. 2 shows a layout of a surface mount grid array package of an electronic component having 1247 input/output (I/O) contacts.

Referring to FIG. 2, there is shown a layout 30 of a surface mount grid array package of an electronic component having 1247 input/output (I/O) contacts. FIG. 2 also shows a legend indicating the type of signal associated with I/O contact.

Figure 3:
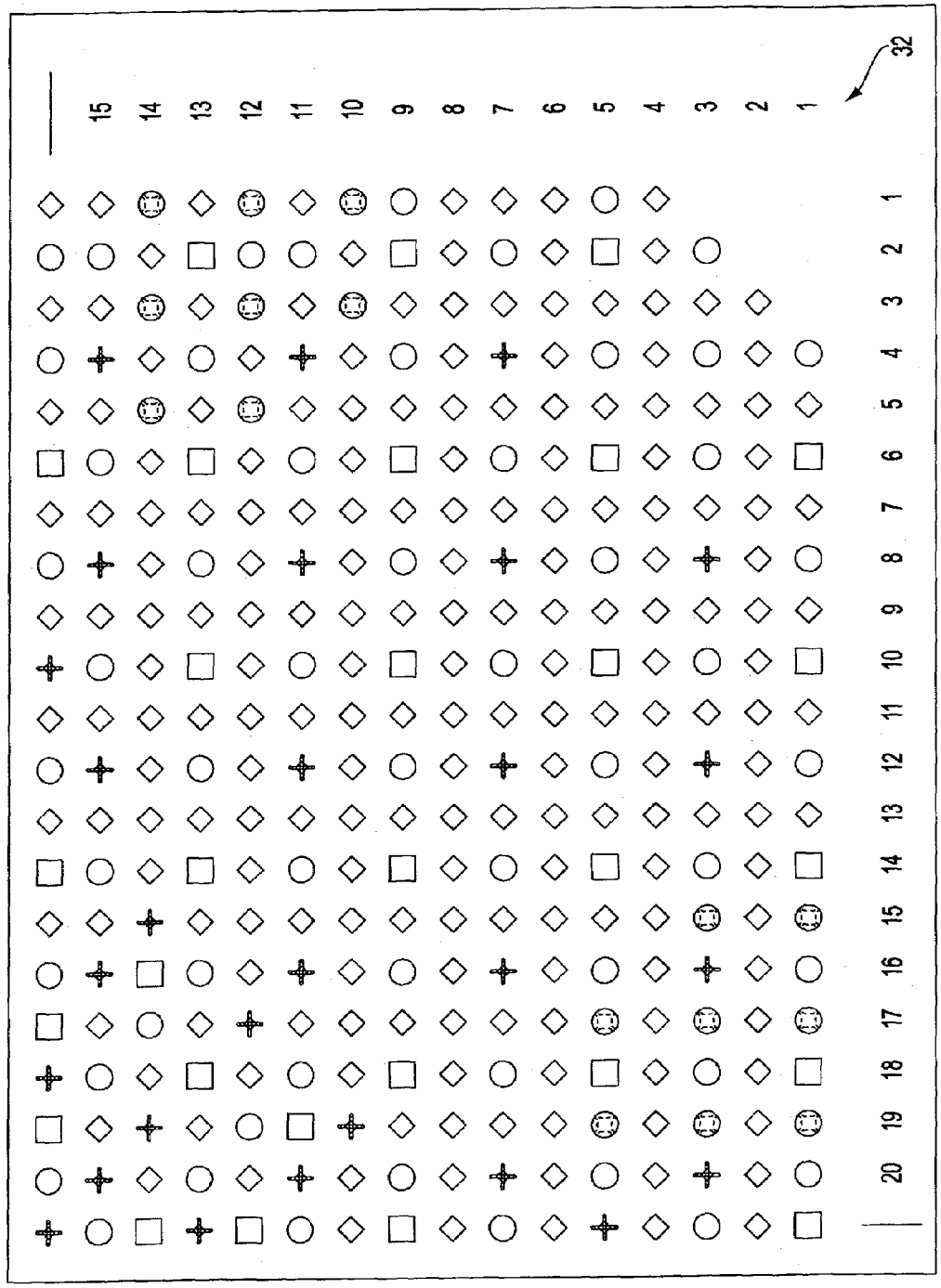
FIG. 3 shows one quadrant (i.e., the lower right quadrant) of the layout shown in FIG. 2.

In order to increase the resolution for purposes of better understanding this detailed description, FIG. 3 shows one quadrant 32 (i.e., the lower right quadrant) of the layout 30 shown in FIG. 2. FIGS. 4–16 directly coincide with the quadrant 32 shown in FIG. 3. The signal type legend in FIG. 2 also applies to FIG. 3, as well as to FIGS. 4–16.

Figure 4:
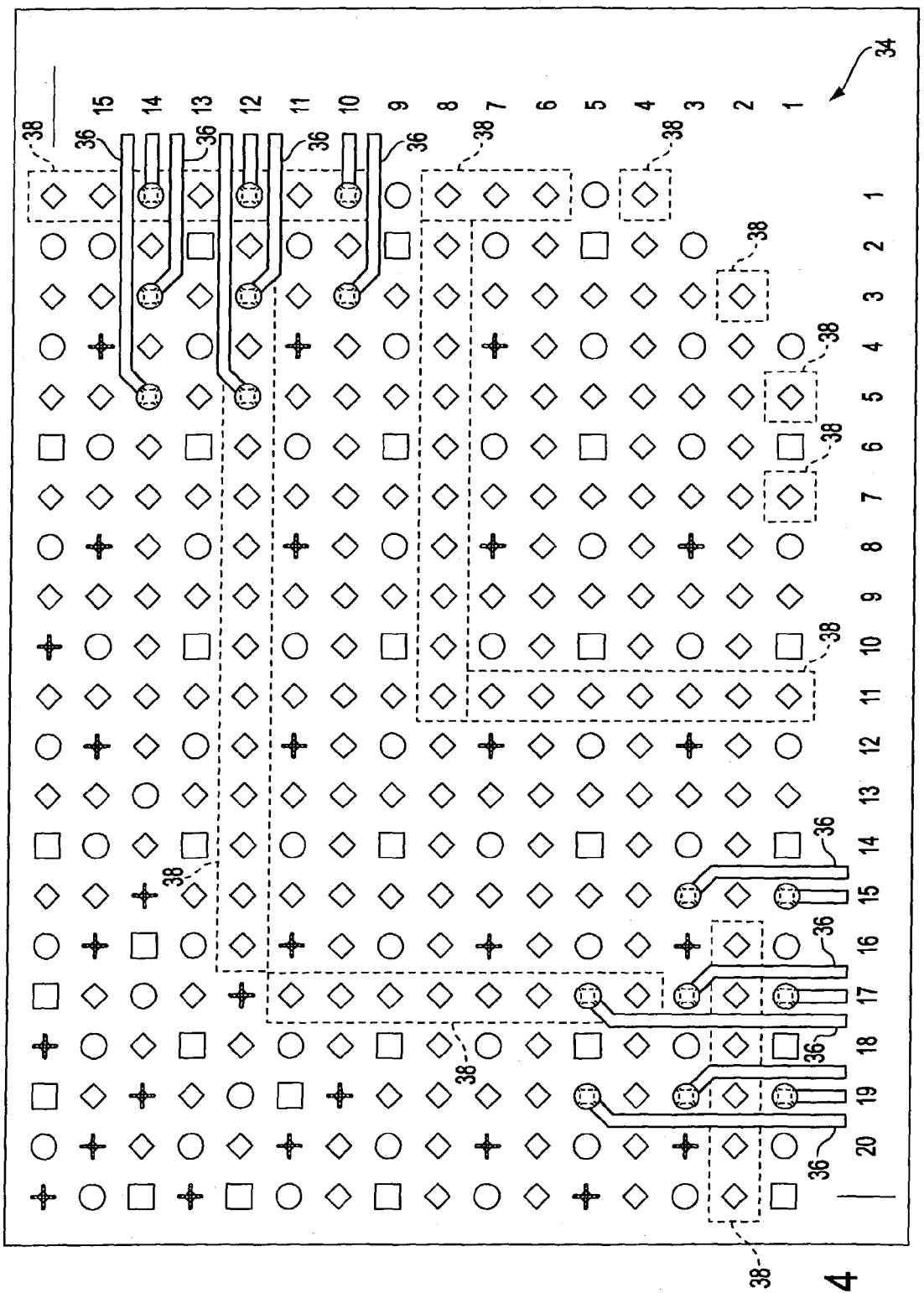
FIG. 4 shows a portion of the primary layer of the multilayer printed circuit board shown in FIG. 1.

Referring to FIG. 4, there is shown a portion 34 of the primary layer 12 of the multilayer printed circuit board 10. As indicated above, this portion 34 of the primary layer 12 directly coincides with the quadrant 32 shown in FIG. 3. That is, this portion 34 of the primary layer 12 corresponds to the portion of the multilayer printed circuit board 10 where one quadrant of an electronic component having a surface mount grid array package with 1247 I/O contacts is mounted on the multilayer printed circuit board 10.

As indicated above, the primary layer 12 is primarily a power/ground plane layer except for contact pads and test signal runs formed thereon. More particularly, the primary layer 12 includes a ground plane that is electrically connected to ground contact pads (i.e., GND in legend), but is not electrically connected to power contact pads (i.e., Vdd and Vdd2 in legend), signal contact pads (i.e., signal in legend), or test contact pads (i.e., test in legend). The ground plane of the primary layer 12 is also not electrically connected to a plurality of test signal runs 36 formed on the primary layer 12.

Also shown in FIG. 4 are areas 38 of the multilayer printed circuit board 10 where channels are formed in other layers of the multilayer printed circuit board 10 in accordance with the present invention. These areas 38 also indicate where microvias or via-in-pads are formed in the multilayer printed circuit board 10. That is, all of the contact pads within these areas 38 are formed as microvias or via-in-pads for facilitating the formation of channels in other layers of the multilayer printed circuit board 10 in accordance with the present invention, as described in detail below.

Figure 5:
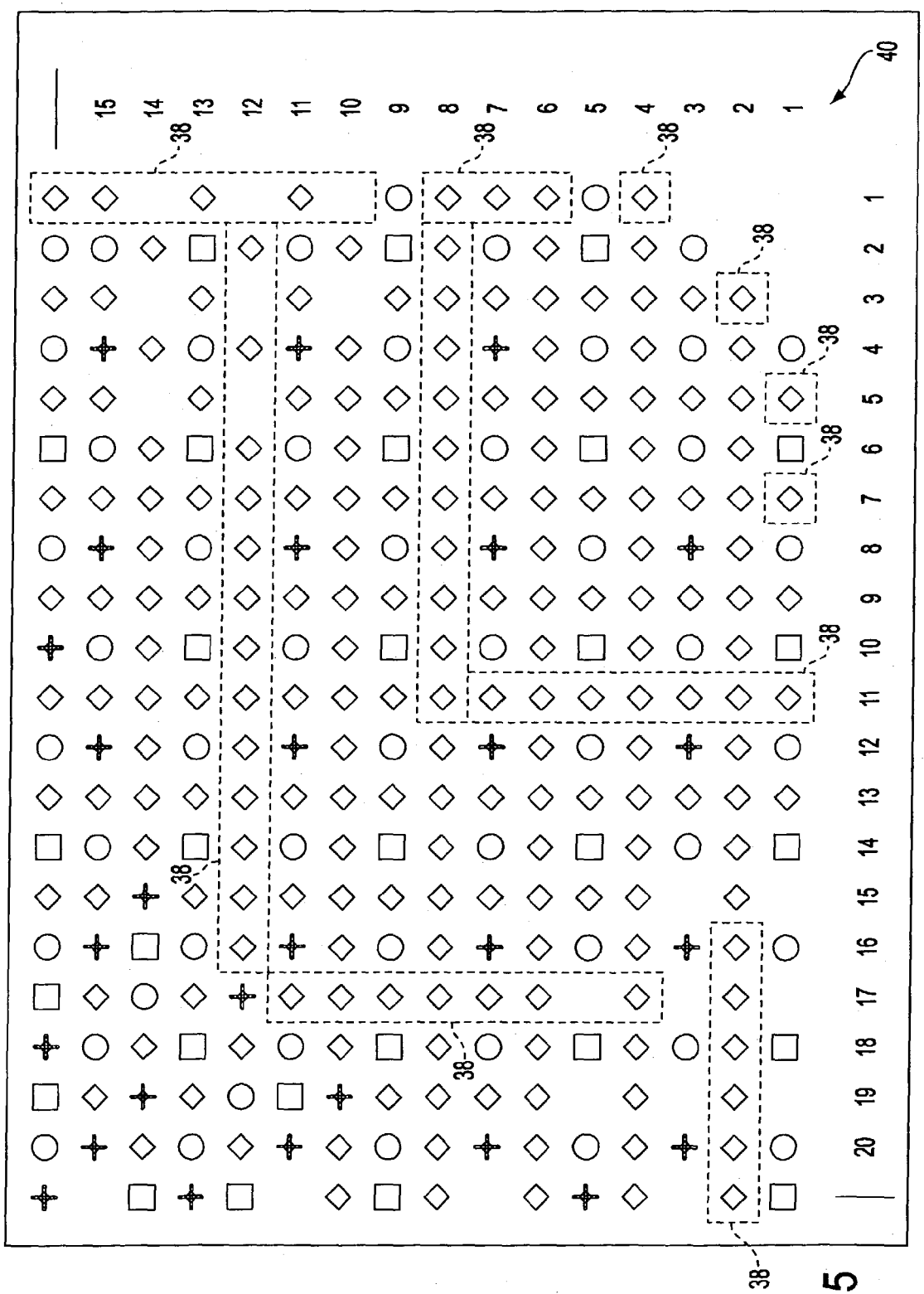
FIG. 5 shows a portion of a first power/ground plane layer of the multilayer printed circuit board shown in FIG. 1.

Referring to FIG. 5, there is shown a portion 40 of the power/ground plane layer 18a of the multilayer printed circuit board 10. As indicated above, this portion 40 of the power/ground plane layer 18a directly coincides with the quadrant 32 shown in FIG. 3. That is, this portion 40 of the power/ground plane layer 18a corresponds to the portion of the multilayer printed circuit board 10 where one quadrant of an electronic component having a surface mount grid array package with 1247 I/O contacts is mounted on the multilayer printed circuit board 10.

The power/ground plane layer 18a is primarily a ground plane layer except for vias formed therein. More particularly, the power/ground layer 18a includes a ground plane that is electrically connected to ground vias (i.e., GND in legend), but is not electrically connected to power vias (i.e., Vdd and Vdd2 in legend) or signal vias (i.e., signal in legend). Note that there are no test vias formed in the power/ground plane layer 18a as test contact pads and test signal runs are typically only formed on the primary layer 12.

Also shown in FIG. 5 are the areas 38 of the multilayer printed circuit board 10 where channels are formed in other layers of the multilayer printed circuit board 10 in accordance with the present invention. Again, these areas 38 also indicate where microvias or via-in-pads are formed in the multilayer printed circuit board 10. That is, all of the vias within these areas 38 are formed as microvias or via-in-pads for facilitating the formation of channels in other layers of the multilayer printed circuit board 10 in accordance with the present invention, as described in detail below.

Figure 6:
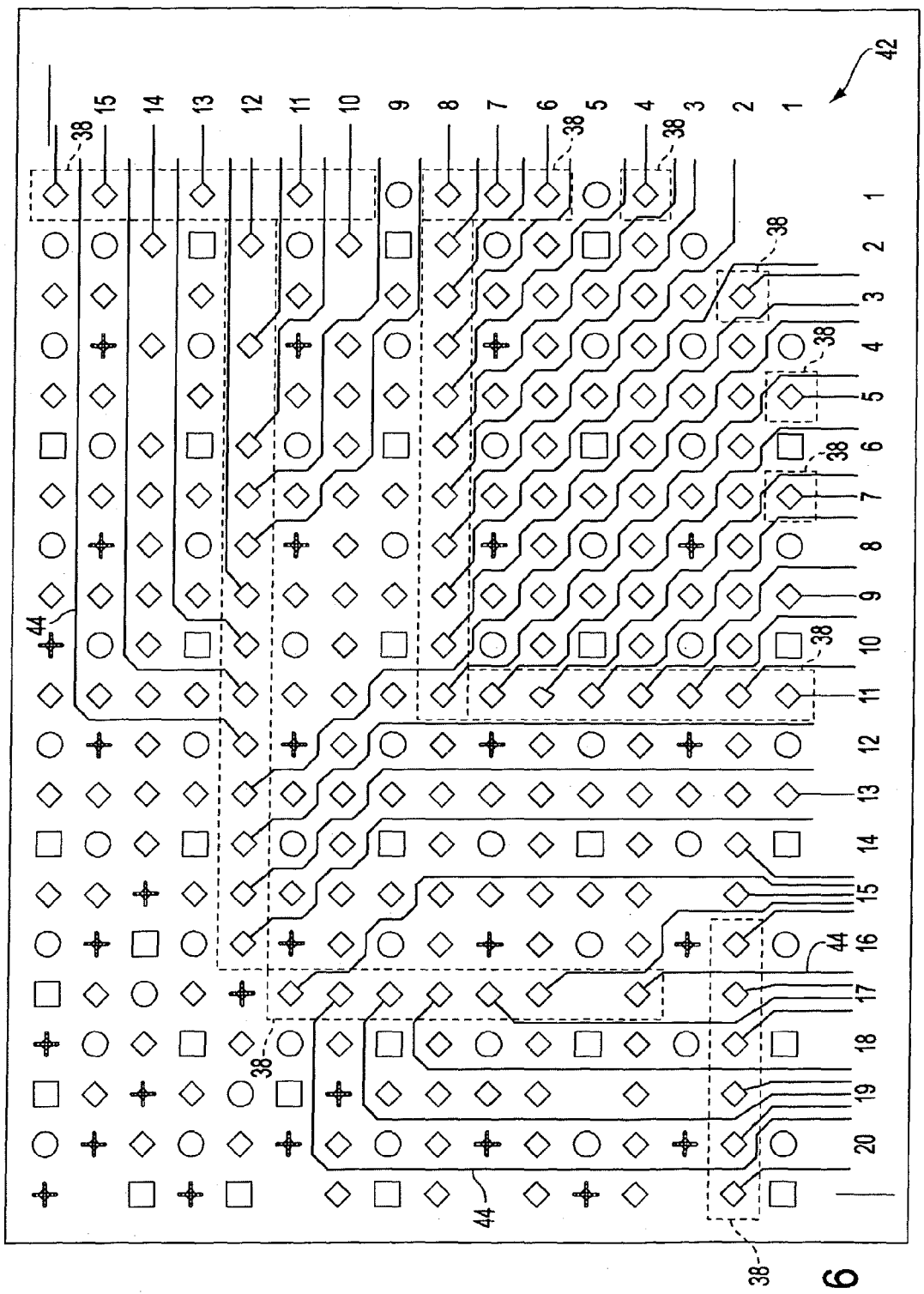
FIG. 6 shows a portion of a first signal layer of the multilayer printed circuit board shown in FIG. 1.

Referring to FIG. 6, there is shown a portion 42 of the signal layer 16a of the multilayer printed circuit board 10. As indicated above, this portion 42 of the signal layer 16a directly coincides with the quadrant 32 shown in FIG. 3. That is, this portion 42 of the power/ground plane layer 18a corresponds to the portion of the multilayer printed circuit board 10 where one quadrant of an electronic component having a surface mount grid array package with 1247 I/O contacts is mounted on the multilayer printed circuit board 10.

The signal layer 16a includes a plurality of electrically conductive signal runs 44 that are electrically connected to the microvias or via-in-pads in the areas 38 of the multilayer printed circuit board 10 where channels are formed in other layers of the multilayer printed circuit board 10 in accordance with the present invention. These signal runs 44 are typically preselected based upon the characteristics of the signals they carry. That is, the signals runs 44 may carry high speed signals. Alternatively, the signals runs 44 may carry low speed signals. Importantly, the microvias or via-in-pads that are formed in the areas 38 of the multilayer printed circuit board 10 do not extend any further into the multilayer printed circuit board 10 than the signal layer 16a. This allows channels to be formed beneath these microvias or via-in-pads in other layers of the multilayer printed circuit board 10, as described in detail below.

Figure 7:
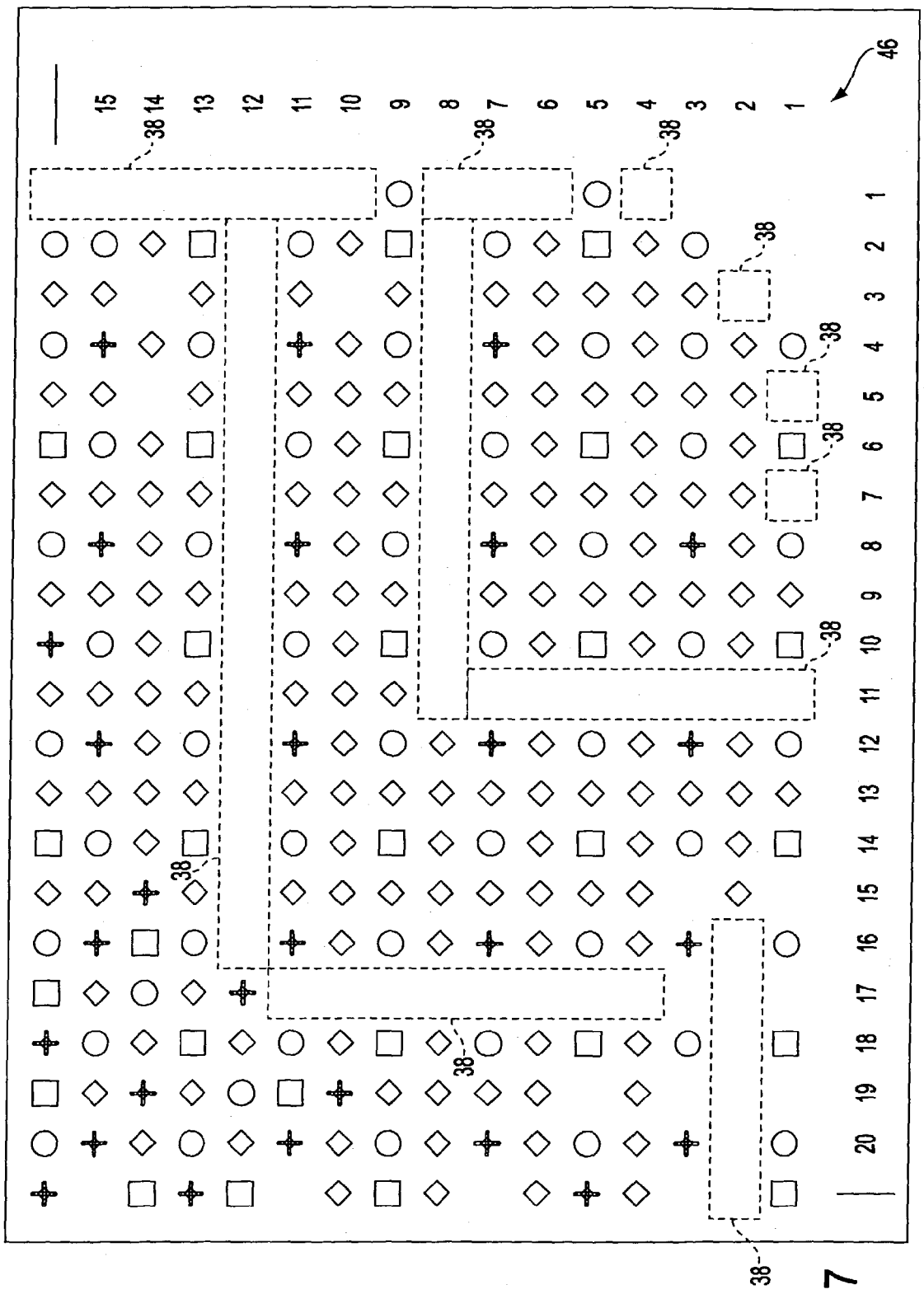
FIG. 7 shows a portion of a second power/ground plane layer of the multilayer printed circuit board shown in FIG. 1.

Referring to FIG. 7, there is shown a portion 46 of the power/ground plane layer 18b of the multilayer printed circuit board 10. As indicated above, this portion 46 of the power/ground plane layer 18b directly coincides with the quadrant 32 shown in FIG. 3. That is, this portion 46 of the power/ground plane layer 18b corresponds to the portion of the multilayer printed circuit board 10 where one quadrant of an electronic component having a surface mount grid array package with 1247 I/O contacts is mounted on the multilayer printed circuit board 10.

The power/ground plane layer 18b is primarily a power plane layer except for vias formed therein. More particularly, the power/ground layer 18b includes a power plane that is electrically connected to power vias (i.e., Vdd in legend), but is not electrically connected to ground vias (i.e., GND in legend) or signal vias (i.e., signal in legend). Note that there are no test vias formed in the power/ground plane layer 18b as test contact pads and test signal runs are typically only formed on the primary layer 12. Also note that there are no vias formed in the power/ground plane layer 18b in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the power/ground plane layer 18b because microvias or via-in-pads are only formed in these areas 38 of the multilayer printed circuit board 10 extending from the primary layer 12 to the signal layer 16a, as described above.

Figure 8:
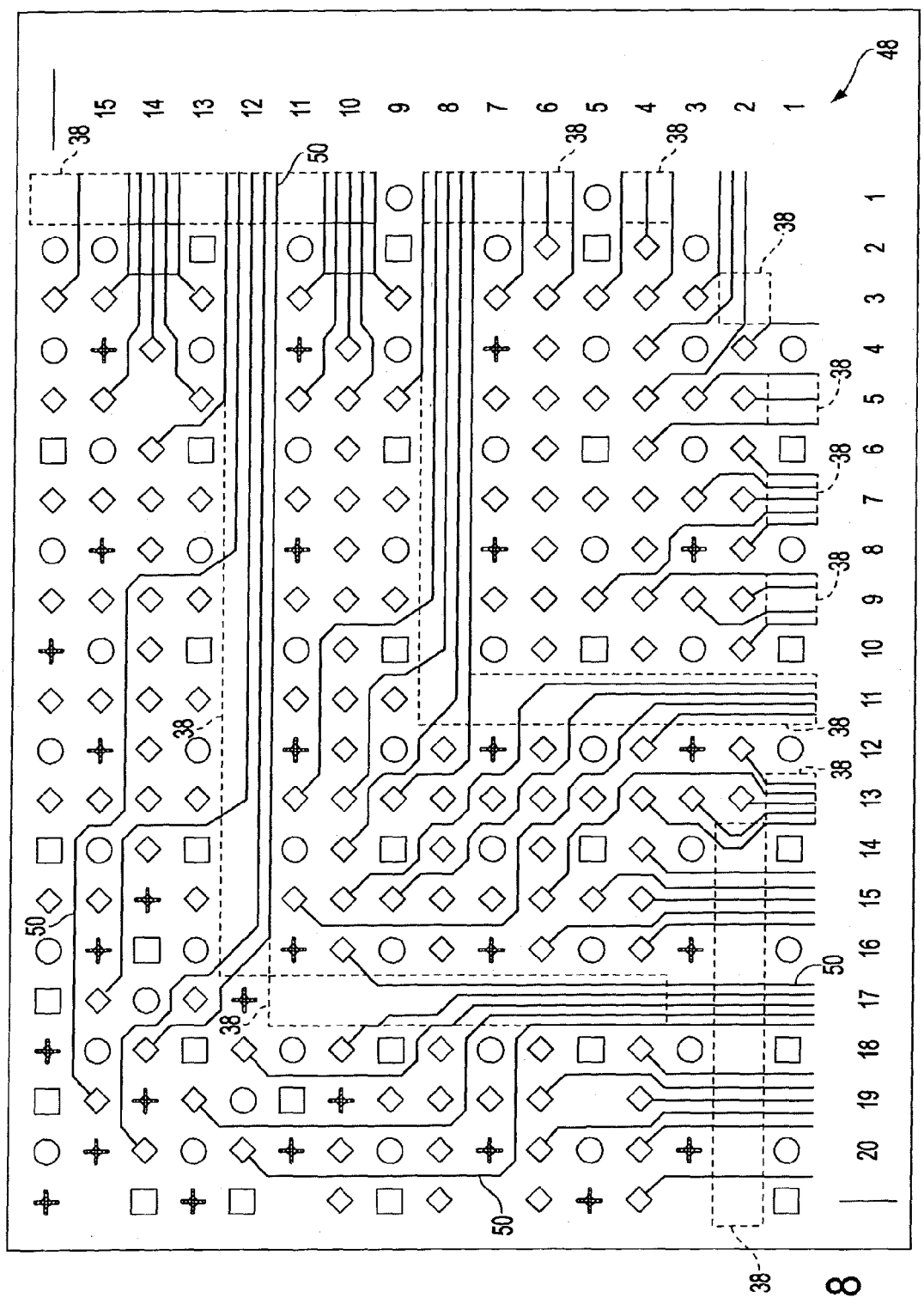
FIG. 8 shows a portion of a second signal layer of the multilayer printed circuit board shown in FIG. 1.

Referring to FIG. 8, there is shown a portion 48 of the signal layer 16b of the multilayer printed circuit board 10. As indicated above, this portion 48 of the signal layer 16b directly coincides with the quadrant 32 shown in FIG. 3. That is, this portion 48 of the signal layer 16b corresponds to the portion of the multilayer printed circuit board 10 where one quadrant of an electronic component having a surface mount grid array package with 1247 I/O contacts is mounted on the multilayer printed circuit board 10.

The signal layer 16b includes a plurality of electrically conductive signal runs 50 that are electrically connected to vias formed in the signal layer 16b outside the areas 38 of the multilayer printed circuit board 10 where channels are formed in this and other layers of the multilayer printed circuit board 10. In accordance with the present invention, many of these signal runs 50 are routed in these channels. That is, the channels formed by the absence of vias in the signal layer 16b in the areas 38 of the multilayer printed circuit board 10 allow the plurality of electrically conductive signal runs 50 to be routed therein. Otherwise, if vias were present in these areas 38 in this and other layers of the multilayer printed circuit board 10, then additional signal layers would be required to route the plurality of electrically conductive signal runs 50. Thus, the absence of vias in these areas 38 in this and other layers of the multilayer printed circuit board 10 allow for an overall reduction in the number of signal layers required in the multilayer printed circuit board 10.

At this point it should be noted that the channels formed in the areas 38 of the multilayer printed circuit board 10 are beneficially arranged so as to intersect at least one edge of the grid array. The benefit of this arrangement is to allow the plurality of electrically conductive signal runs 50 to be more easily routed out from within the grid array. In fact, as shown in FIG. 8, some of the channels formed in the areas 38 of the multilayer printed circuit board 10 intersect more than one edge of the grid array. These multiple edge intersecting channels are typically formed of orthogonal columns and rows, but may also be formed in diagonal or random patterns.

It should also be noted that the channels formed in the areas 38 of the multilayer printed circuit board 10 may have varying widths. That is, while the channels formed in the areas 38 of the multilayer printed circuit board 10 are shown in FIG. 8 as having a width of one contact pad or via, the present invention is not limited in this regard. For example, the channels formed in the areas 38 of the multilayer printed circuit board 10 can be two or more contact pads or vias wide depending upon how many microvias or via-in-pads are used and how many vias are removed in accordance with the practices of the present invention as described above.

Figure 9:
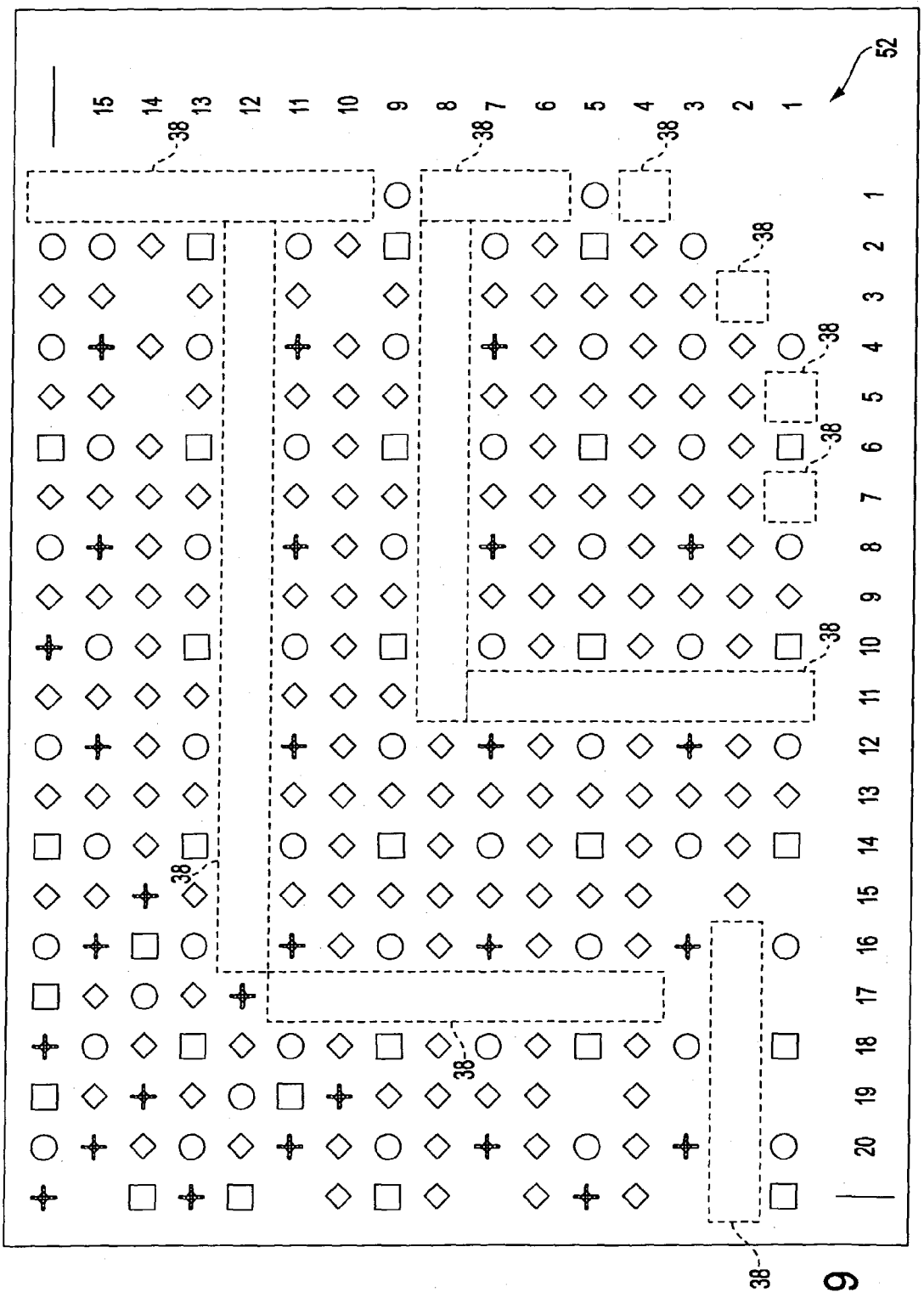
FIG. 9 shows a portion of a third power/ground plane layer of the multilayer printed circuit board shown in FIG. 1.

Referring to FIG. 9, there is shown a portion 52 of the power/ground plane layer 18c of the multilayer printed circuit board 10. As indicated above, this portion 52 of the power/ground plane layer 18c directly coincides with the quadrant 32 shown in FIG. 3. That is, this portion 52 of the power/ground plane layer 18c corresponds to the portion of the multilayer printed circuit board 10 where one quadrant of an electronic component having a surface mount grid array package with 1247 I/O contacts is mounted on the multilayer printed circuit board 10.

The power/ground plane layer 18c is primarily a ground plane layer except for vias formed therein. More particularly, the power/ground layer 18c includes a ground plane that is electrically connected to ground vias (i.e., GND in legend), but is not electrically connected to power vias (i.e., Vdd and Vdd2 in legend) or signal vias (i.e., signal in legend). Note that there are no test vias formed in the power/ground plane layer 18c as test contact pads and test signal runs are typically only formed on the primary layer 12. Also note that there are no vias formed in the power/ground plane layer 18c in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the power/ground plane layer 18c because microvias or via-in-pads are only formed in these areas 38 of the multilayer printed circuit board 10 extending from the primary layer 12 to the signal layer 16a, as described above.

Figure 10:
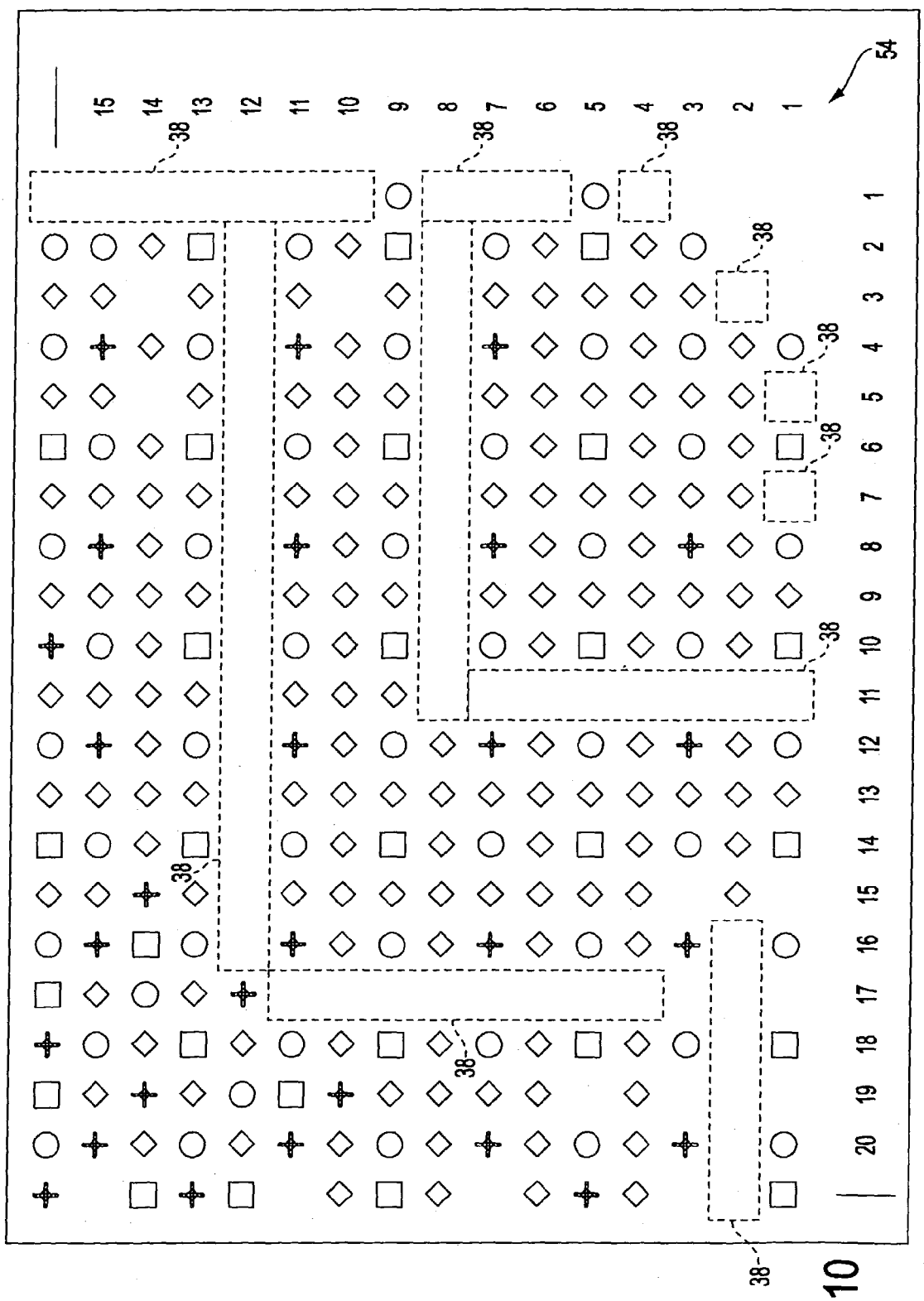
FIG. 10 shows a portion of a fourth power/ground plane layer of the multilayer printed circuit board shown in FIG. 1.

Referring to FIG. 10, there is shown a portion 54 of the power/ground plane layer 18d of the multilayer printed circuit board 10. As indicated above, this portion 54 of the power/ground plane layer 18d directly coincides with the quadrant 32 shown in FIG. 3. That is, this portion 54 of the power/ground plane layer 18d corresponds to the portion of the multilayer printed circuit board 10 where one quadrant of an electronic component having a surface mount grid array package with 1247 I/O contacts is mounted on the multilayer printed circuit board 10.

Similar to power/ground plane layer 18b, the power/ground plane layer 18d is primarily a power plane layer except for vias formed therein. More particularly, the power/ground layer 18d includes a power plane that is electrically connected to power vias (i.e., Vdd2 in legend), but is not electrically connected to ground vias (i.e., GND in legend) or signal vias (i.e., signal in legend). Note that there are no test vias formed in the power/ground plane layer 18d as test contact pads and test signal runs are typically only formed on the primary layer 12. Also note that there are no vias formed in the power/ground plane layer 18d in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the power/ground plane layer 18d because microvias or via-in-pads are only formed in these areas 38 of the multilayer printed circuit board 10 extending from the primary layer 12 to the signal layer 16a, as described above.

Figure 11:
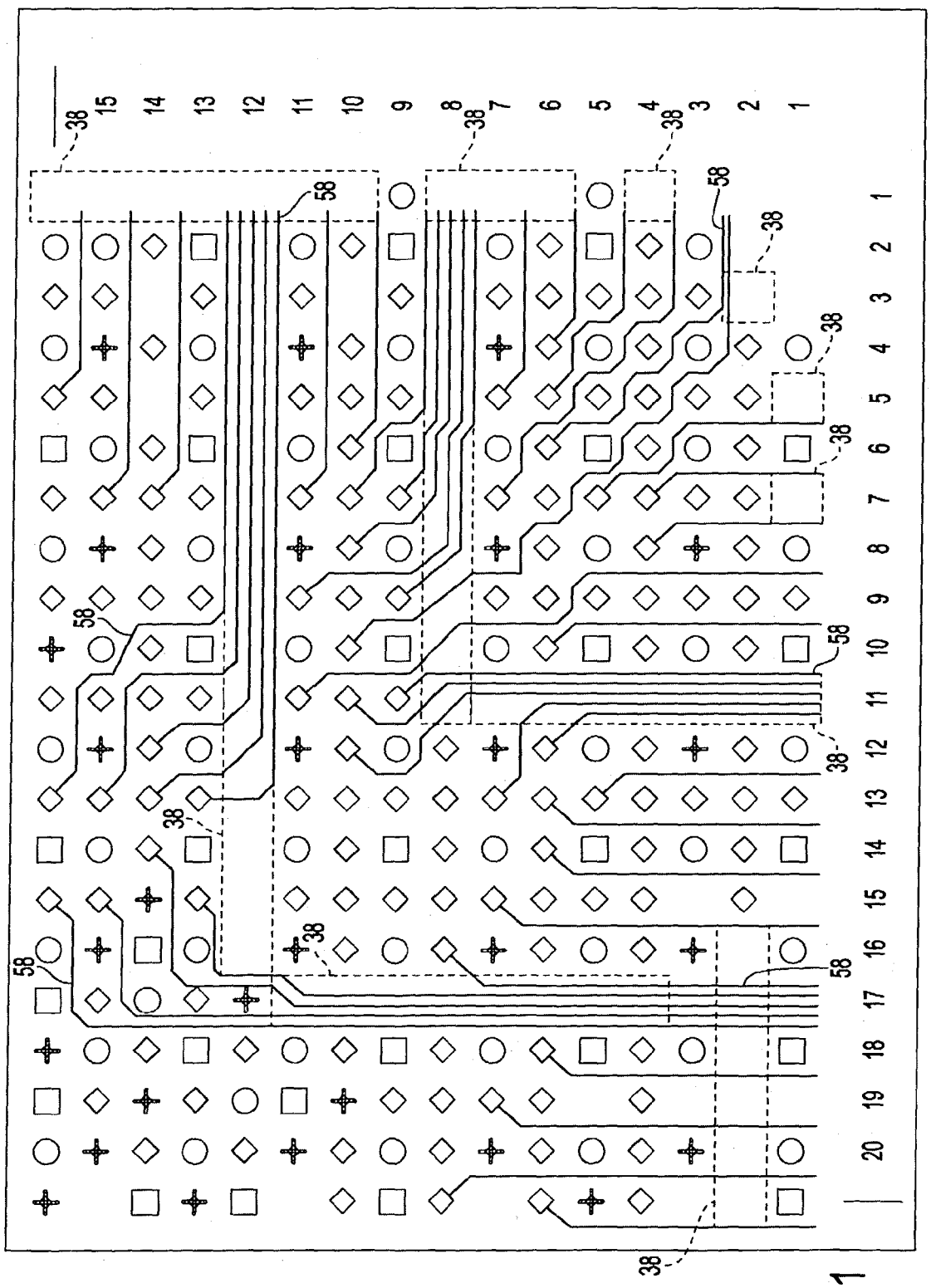
FIG. 11 shows a portion of a third signal layer of the multilayer printed circuit board shown in FIG. 1.

Referring to FIG. 11, there is shown a portion 56 of the signal layer 16c of the multilayer printed circuit board 10. As indicated above, this portion 56 of the signal layer 16c directly coincides with the quadrant 32 shown in FIG. 3. That is, this portion 56 of the signal layer 16c corresponds to the portion of the multilayer printed circuit board 10 where one quadrant of an electronic component having a surface mount grid array package with 1247 I/O contacts is mounted on the multilayer printed circuit board 10.

The signal layer 16c includes a plurality of electrically conductive signal runs 58 that are electrically connected to vias formed in the signal layer 16c outside the areas 38 of the multilayer printed circuit board 10 where channels are formed in this and other layers of the multilayer printed circuit board 10. In accordance with the present invention, many of these signal runs 58 are routed in these channels. That is, the channels formed by the absence of vias in the signal layer 16c in the areas 38 of the multilayer printed circuit board 10 allow the plurality of electrically conductive signal runs 58 to be routed therein. Otherwise, if vias were present in these areas 38 in this and other layers of the multilayer printed circuit board 10, then additional signal layers would be required to route the plurality of electrically conductive signal runs 58. Thus, the absence of vias in these areas 38 in this and other layers of the multilayer printed circuit board 10 allow for an overall reduction in the number of signal layers required in the multilayer printed circuit board 10.

Figure 12:
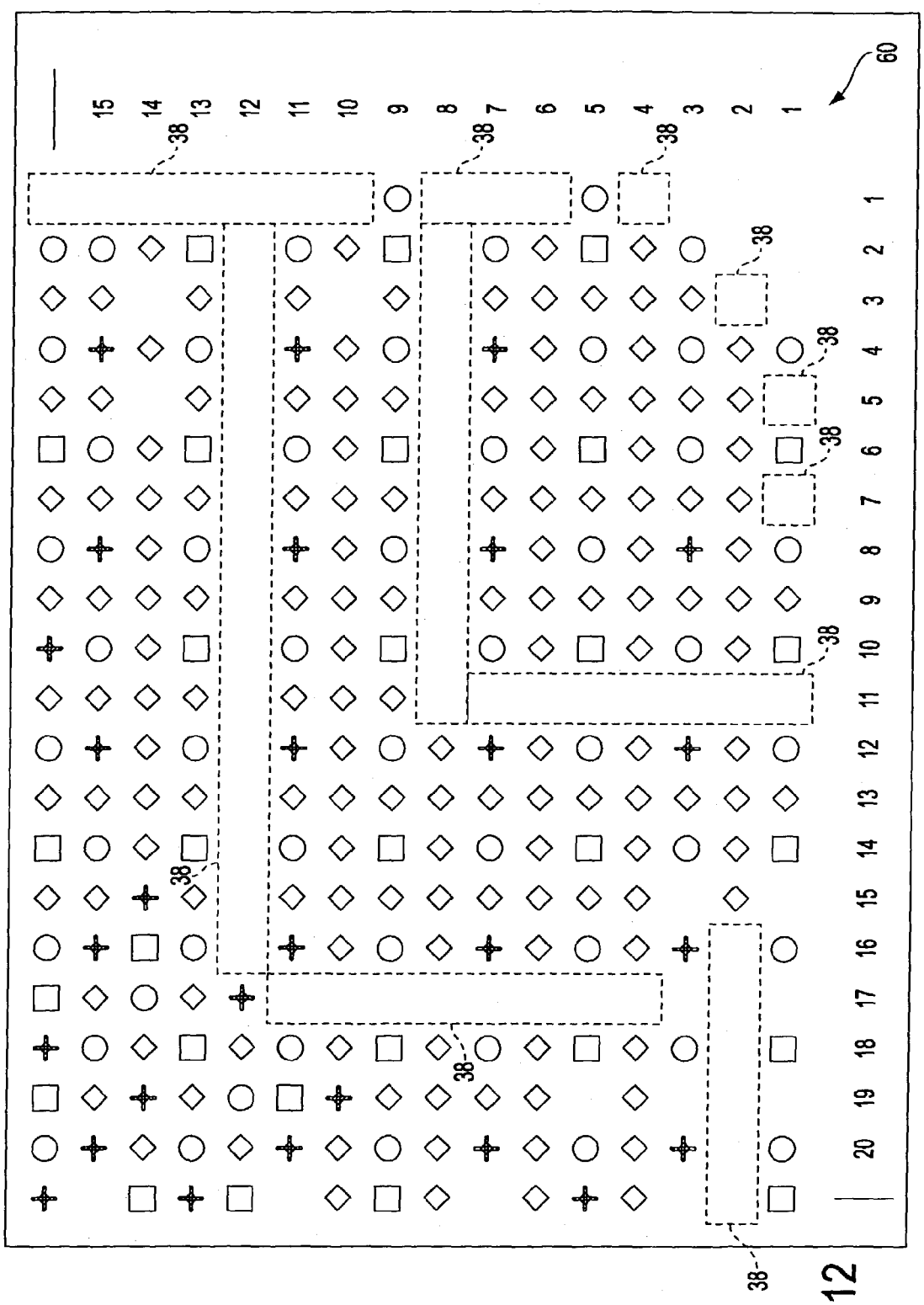
FIG. 12 shows a portion of a fifth power/ground plane layer of the multilayer printed circuit board shown in FIG. 1.

Referring to FIG. 12, there is shown a portion 60 of the power/ground plane layer 18e of the multilayer printed circuit board 10. As indicated above, this portion 60 of the power/ground plane layer 18e directly coincides with the quadrant 32 shown in FIG. 3. That is, this portion 60 of the power/ground plane layer 18e corresponds to the portion of the multilayer printed circuit board 10 where one quadrant of an electronic component having a surface mount grid array package with 1247 I/O contacts is mounted on the multilayer printed circuit board 10.

Similar to power/ground plane layer 18c, the power/ground plane layer 18e is primarily a ground plane layer except for vias formed therein. More particularly, the power/ground layer 18e includes a ground plane that is electrically connected to ground vias (i.e., GND in legend), but is not electrically connected to power vias (i.e., Vdd and Vdd2 in legend) or signal vias (i.e., signal in legend). Note that there are no test vias formed in the power/ground plane layer 18e as test contact pads and test signal runs are typically only formed on the primary layer 12. Also note that there are no vias formed in the power/ground plane layer 18e in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the power/ground plane layer 18e because microvias or via-in-pads are only formed in these areas 38 of the multilayer printed circuit board 10 extending from the primary layer 12 to the signal layer 16a, as described above.

Figure 13:
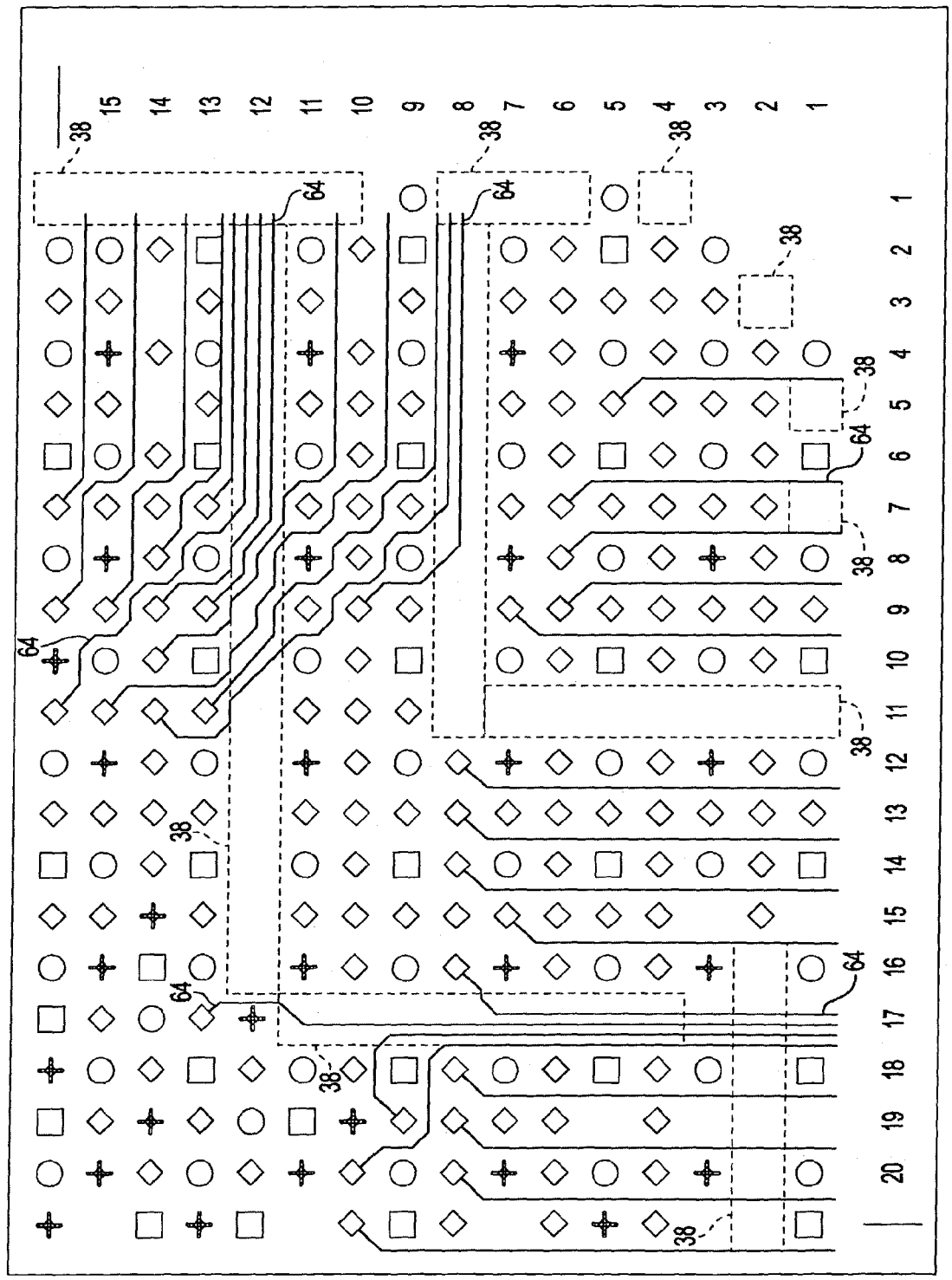
FIG. 13 shows a portion of a fourth signal layer of the multilayer printed circuit board shown in FIG. 1.

Referring to FIG. 13, there is shown a portion 62 of the signal layer 16d of the multilayer printed circuit board 10. As indicated above, this portion 62 of the signal layer 16d directly coincides with the quadrant 32 shown in FIG. 3. That is, this portion 62 of the signal layer 16d corresponds to the portion of the multilayer printed circuit board 10 where one quadrant of an electronic component having a surface mount grid array package with 1247 I/O contacts is mounted on the multilayer printed circuit board 10.

The signal layer 16d includes a plurality of electrically conductive signal runs 64 that are electrically connected to vias formed in the signal layer 16d outside the areas 38 of the multilayer printed circuit board 10 where channels are formed in this and other layers of the multilayer printed circuit board 10. In accordance with the present invention, many of these signal runs 64 are routed in these channels. That is, the channels formed by the absence of vias in the signal layer 16d in the areas 38 of the multilayer printed circuit board 10 allow the plurality of electrically conductive signal runs 64 to be routed therein. Otherwise, if vias were present in these areas 38 in this and other layers of the multilayer printed circuit board 10, then additional signal layers would be required to route the plurality of electrically conductive signal runs 64. Thus, the absence of vias in these areas 38 in this and other layers of the multilayer printed circuit board 10 allow for an overall reduction in the number of signal layers required in the multilayer printed circuit board 10.

Figure 14:
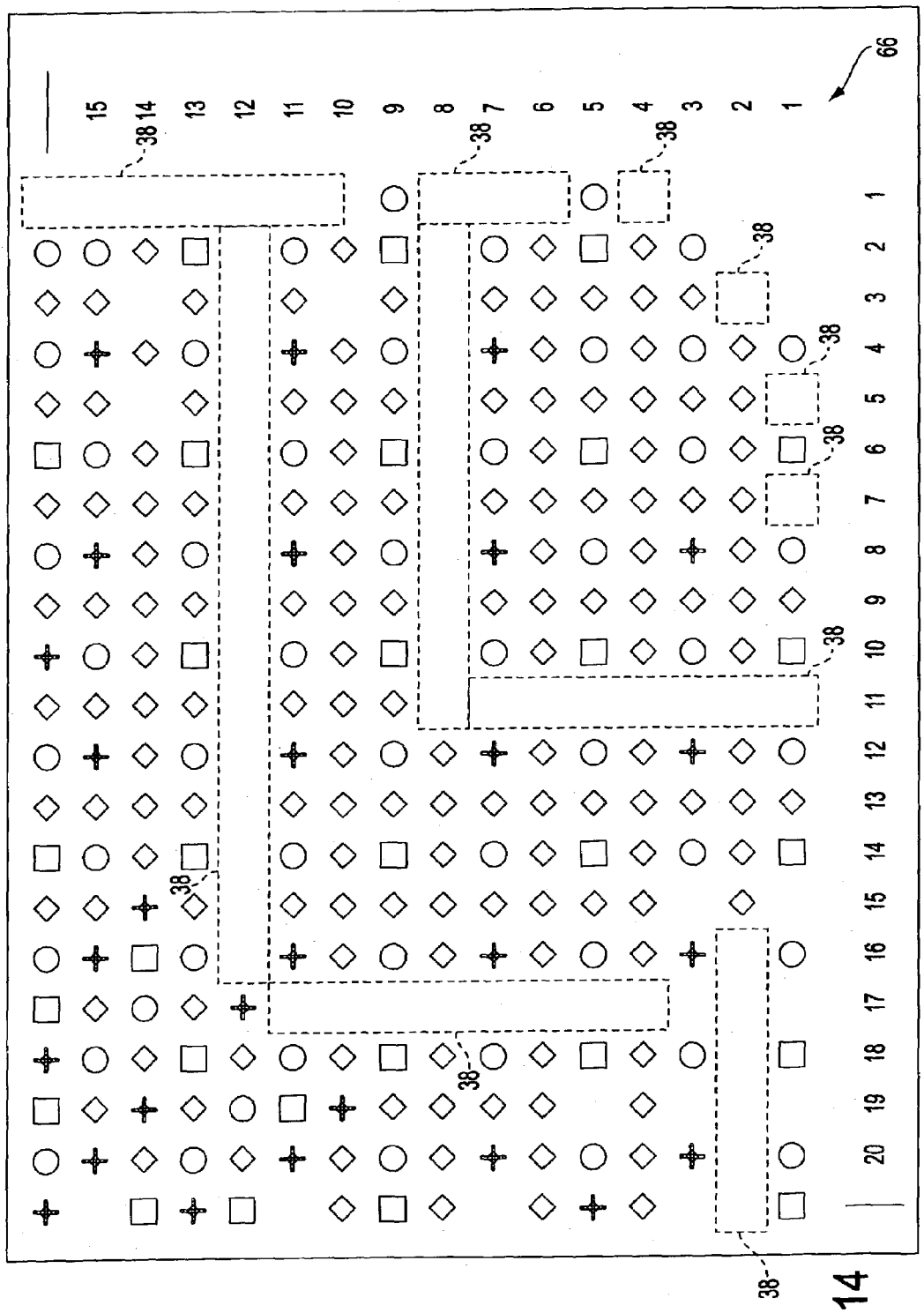
FIG. 14 shows a portion of a sixth power/ground plane layer of the multilayer printed circuit board shown in FIG. 1.

Referring to FIG. 14, there is shown a portion 66 of the power/ground plane layer 18f of the multilayer printed circuit board 10. As indicated above, this portion 66 of the power/ground plane layer 18f directly coincides with the quadrant 32 shown in FIG. 3. That is, this portion 66 of the power/ground plane layer 18f corresponds to the portion of the multilayer printed circuit board 10 where one quadrant of an electronic component having a surface mount grid array package with 1247 I/O contacts is mounted on the multilayer printed circuit board 10.

Similar to power/ground plane layers 18c and 18e, the power/ground plane layer 18f is primarily a ground plane layer except for vias formed therein. More particularly, the power/ground plane layer 18f includes a ground plane that is electrically connected to ground vias (i.e., GND in legend), but is not electrically connected to power vias (i.e., Vdd and Vdd2 in legend) or signal vias (i.e., signal in legend). Note that there are no test vias formed in the power/ground plane layer 18f as test contact pads and test signal runs are typically only formed on the primary layer 12. Also note that there are no vias formed in the power/ground plane layer 18f in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the power/ground plane layer 18f because microvias or via-in-pads are only formed in these areas 38 of the multilayer printed circuit board 10 extending from the primary layer 12 to the signal layer 16a, as described above.

Figure 15:
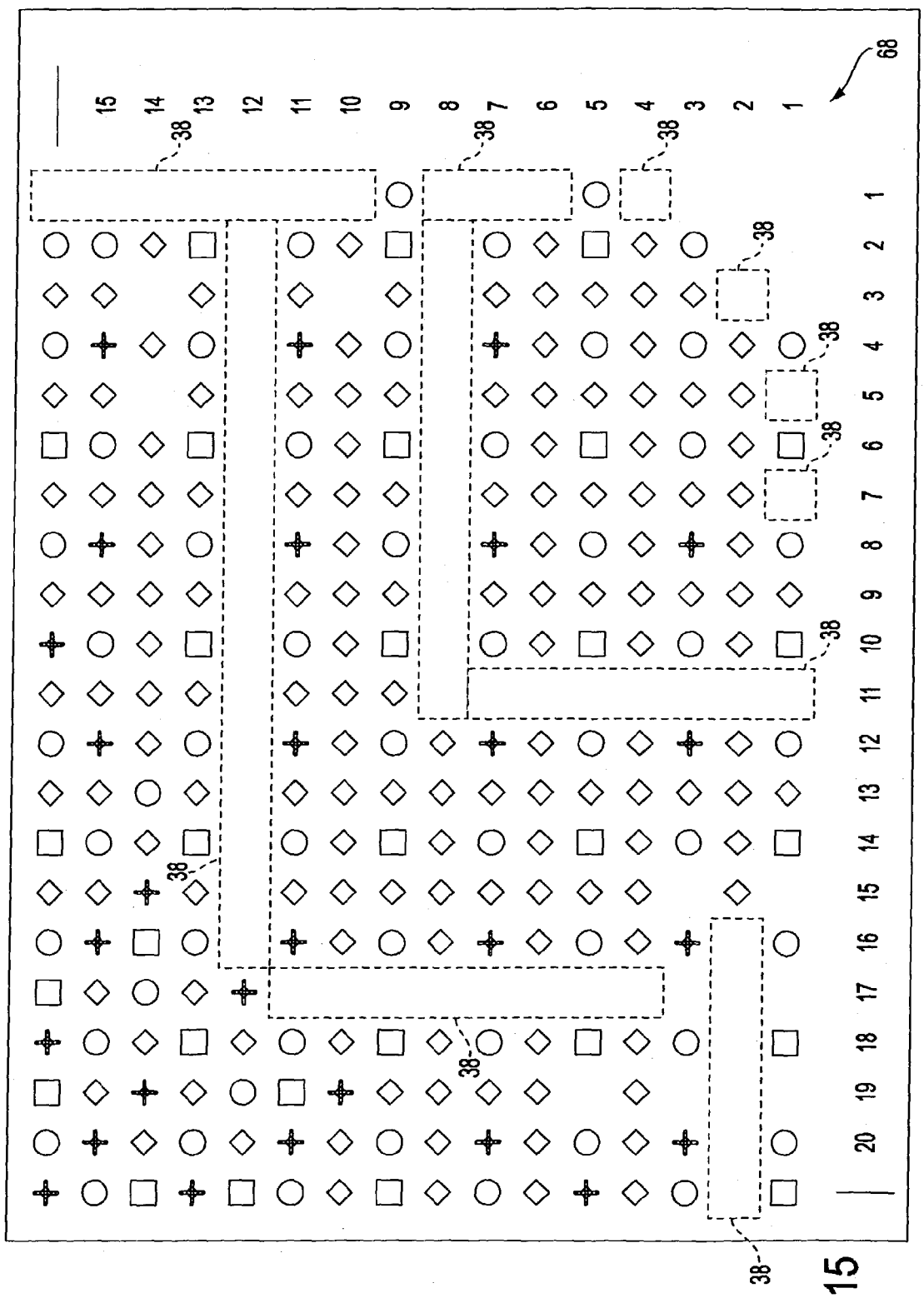
FIG. 15 shows a portion of the secondary layer of the multilayer printed circuit board shown in FIG. 1.
Figure 16:
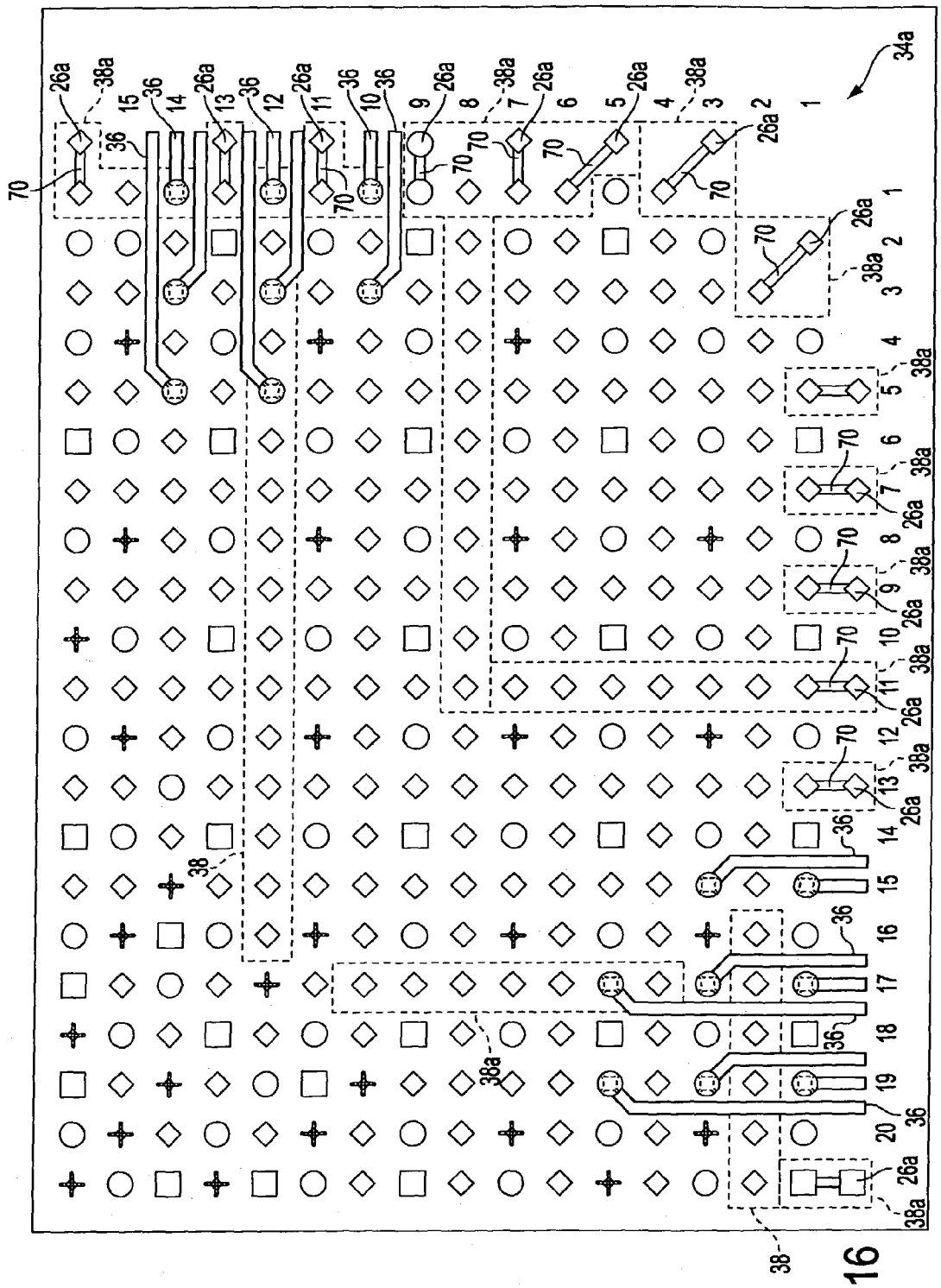
FIG. 16 shows an alternative embodiment of a portion of the primary layer of the multilayer printed circuit board shown in FIG. 1.

Referring to FIG. 15, there is shown a portion 68 of the secondary layer 14 of the multilayer printed circuit board 10. As indicated above, this portion 68 of the secondary layer 14 directly coincides with the quadrant 32 shown in FIG. 3. That is, this portion 68 of the secondary layer 14 corresponds to the portion of the multilayer printed circuit board 10 where one quadrant of an electronic component having a surface mount grid array package with 1247 I/O contacts is mounted on the multilayer printed circuit board 10.

As indicated above, the secondary layer 14 is primarily a power/ground plane layer except for contact pads formed thereon. More particularly, the secondary layer 14 includes a ground plane that is electrically connected to ground contact pads (i.e., GND in legend), but is not electrically connected to power contact pads (i.e., Vdd and Vdd2 in legend) or signal contact pads (i.e., signal in legend). Note that there are no test vias formed in the secondary layer 14 as test contact pads and test signal runs are typically only formed on the primary layer 12. Also note that there are no vias formed in the secondary layer 14 in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the secondary layer 14 because microvias or via-in-pads are only formed in these areas 38 of the multilayer printed circuit board 10 extending from the primary layer 12 to the signal layer 16a, as described above.

At this point it should be noted that the above-described techniques for reducing the number of layers in a multilayer printed circuit board have been substantially described in the above-referenced U.S. patent application Ser. No. 10/126,700, U.S. patent application Ser. No. 09/651,188 (now U.S. Pat. No. 6,388,890), and U.S. Provisional Patent Application No. 60/212,387, all of which have been incorporated by reference herein in their entirety. Also, related techniques for reducing the number of layers in a multilayer printed circuit board have been substantially described in the above-referenced U.S. patent application Ser. No. 10/101,211, U.S. patent application Ser. No. 09/651,188 (now U.S. Pat. No. 6,388,890), and U.S. Provisional Patent Application No. 60/212,387, all of which have been incorporated by reference herein in their entirety. All of these techniques may be implemented either manually or in an automated manner. For example, these techniques may be automated by receiving electronic component information in, for example, a design file. That is, the design file may include an electrically conductive contact count characteristic, an electrically conductive contact pitch characteristic, an electrically conductive contact signal type characteristic, and/or an electrically conductive contact signal direction characteristic for one or more electronic components. One or more electronic components having a high density electrically conductive contact array package may then be identified based at least in part upon at least one of the electrically conductive contact count characteristic or the electrically conductive contact pitch characteristic. Electrical signals may then be routed on a plurality of electrically conductive signal path layers in a multilayer circuit board so as to make electrical connections to and from each high density electrically conductive contact array package that is mounted on the multilayer circuit board based at least in part upon at least one of the electrically conductive contact signal type characteristic or the electrically conductive contact signal direction characteristic.

Thus, at this point it should be noted that reducing the number of layers in a multilayer printed circuit board in accordance with the present invention as described above may involve the processing of input data and the generation of output data to some extent. This input data processing and output data generation may be implemented in hardware or software. For example, specific electronic and/or optical components may be employed in a processing device or similar or related circuitry for implementing the functions associated with reducing the number of layers in a multilayer printed circuit board in accordance with the present invention as described above. Alternatively, one or more processors operating in accordance with stored instructions may implement the functions associated with reducing the number of layers in a multilayer printed circuit board in accordance with the present invention as described above. If such is the case, it is within the scope of the present invention that such instructions may be stored on one or more processor readable carrier (e.g., a magnetic disk), or transmitted to one or more processors via one or more signals.

At this point it should be noted that, along the lines of that described in the above-referenced U.S. patent application Ser. No. 10/126,700, U.S. patent application Ser. No. 09/651,188 (now U.S. Pat. No. 6,388,890), and U.S. Provisional Patent Application No. 60/212,387, all of which have been incorporated by reference herein in their entirety, one or more microvias 26 may be formed in the multilayer circuit board 10 extending from the surface 12 of the multilayer circuit board 10 to one of the plurality of electrically conductive signal path layers (e.g., 16b), wherein the microvias 26 are arranged so as to form at least one of the channels 38 in another of the plurality of electrically conductive signal path layers (e.g., 16c) located beneath the microvias 26. That is, one or more microvias 26 may extend from the surface 12 of the multilayer circuit board 10 to others of the plurality of electrically conductive signal path layers (e.g., 16b, 16c, 16d) besides the uppermost electrically conductive signal path layer (i.e., 16a).

At this point it should be noted that the channels 38 may be configured to have a linear, circular, diamond, curved, stepped, staggered, and/or random shape, or a combination thereof. Also, the channels 38 may be configured to be in a vertical, horizontal, diagonal, and/or random direction, or a combination thereof. Further, one or more channels 38 may be formed such that they are totally enclosed within the array of electrically conductive contacts that are formed on the multilayer circuit board 10 for mating with the electrically conductive contacts of the electronic component (i.e., no portion of the channel is formed along the periphery of the array of electrically conductive contacts formed on the multilayer circuit board 10) (e.g., see channel 38a in FIG. 16). Additionally, one or more channels 38 may be formed such that they extend all the way across the array of electrically conductive contacts that are formed on the multilayer circuit board 10 for mating with the electrically conductive contacts of the electronic component (i.e., the channel is formed extending from one side to another side of the array of electrically conductive contacts formed on the multilayer circuit board 10). Moreover, one or more channels 38 may be formed such that only portions thereof extend to the periphery of the array of electrically conductive contacts that are formed on the multilayer circuit board 10 for mating with the electrically conductive contacts of the electronic component (i.e., at least a portion of the channel is formed along the periphery of the array of electrically conductive contacts formed on the multilayer circuit board 10).

At this point it should be noted that the electrically conductive contacts of the electronic component, and thus the array of electrically conductive contacts that are formed on the multilayer circuit board 10 for mating with the electrically conductive contacts of the electronic component, may have a variety of contact array patterns. For example, the electrically conductive contacts of the electronic component, and hence the array of electrically conductive contacts formed on the multilayer circuit board 10, may have a square, triangular, circular, and/or random electrically conductive contact pattern, or a combination thereof.

At this point it should be noted that at least some of the electrical signals to be routed may be differential electrical signals. If such is the case, the differential electrical signals may beneficially be at least partially routed together in the channels 38 formed in the plurality of electrically conductive signal path layers 16 beneath the microvias 26, thereby enhancing signal quality.

At this point it should be noted that it may be beneficial to form at least some of the microvias 26 outside of the array of electrically conductive contacts that are formed on the multilayer circuit board 10 for mating with the electrically conductive contacts of the electronic component. For example, referring to FIG. 16, there is shown an alternative embodiment of a portion 34a of the primary layer 12 of the multilayer printed circuit board 10 wherein some of the microvias 26a are formed outside of the array of electrically conductive contacts that are formed on the multilayer circuit board 10 for mating with the electrically conductive contacts of the electronic component. The microvias 26a are electrically connected to corresponding peripheral ones of the electrically conductive array contacts that are formed on the multilayer circuit board 10 for mating with the electrically conductive contacts of the electronic component via electrically conductive connections 70. As discussed above, the microvias 26a may extend from the surface 12 of the multilayer circuit board 10 to any of the plurality of electrically conductive signal path layers 16. However, the peripheral electrically conductive array contacts that are connected to the microvias 26a do not extend below the primary layer 12 of the multilayer printed circuit board 10. Thus, additional and/or expanded channels 38a may be formed in all of the plurality of electrically conductive signal path layers 16 beneath these peripheral electrically conductive array contacts, including the uppermost electrically conductive signal path layer (i.e., 16a).

At this point it should be noted that, along the lines of that described in the above-referenced U.S. patent application Ser. No. 10/101,211, U.S. patent application Ser. No. 09/651,188 (now U.S. Pat. No. 6,388,890), and U.S. Provisional Patent Application No. 60/212,387, all of which have been incorporated by reference herein in their entirety, one or more electrically conductive vias may be formed in the multilayer printed circuit board 10 extending from the surface 12 of the multilayer printed circuit board 10 to at least one of the electrically conductive power/ground layers (i.e., 18 and/or 14), wherein each of the electrically conductive vias is electrically connected to at least one respective electrically conductive power/ground contact formed on the surface 12 of the multilayer printed circuit board 10. Each of the electrically conductive power/ground contacts forms a portion of the electrically conductive contact array that is formed on the surface 12 of the multilayer circuit board 10 for mating with the electrically conductive power/ground contacts of the electronic component. This allows additional channels to be formed in each of the plurality of electrically conductive signal path layers 16 beneath the electrically conductive power/ground contacts.

At this point it should be noted that all of the above-described variations and benefits associated with reducing the number of layers in a multilayer printed circuit board using microvias may also be implemented and obtained using electrically conductive vias that are electrically connected to electrically conductive power/ground contacts, as described above.

At this point it should be noted that, while the above detailed description has thus far been limited to reducing the number of layers in a multilayer printed circuit board having electronic components mounted thereon, it is well within the scope of the present invention to apply the above-described techniques to a multilayer printed circuit board having a wide variety of electronic components embedded therein. For example, referring to FIG. 17, there is shown a side cross-sectional view of an alternative multilayer printed circuit board 10a in accordance with the present invention. Similar to the multilayer printed circuit board 10 of FIG. 1, the multilayer printed circuit board 10a of FIG. 17 comprises a primary (top) layer 12, a secondary (bottom) layer 14, a plurality of signal layers 16, and a plurality of power/ground plane layers 18. The multilayer printed circuit board 10a also comprises a supervia 20 for electrically connecting the primary layer 12, the secondary layer 14, and selected ones of the plurality of power/ground plane layers 18. The multilayer printed circuit board 10a further comprises a plurality of buried vias 24 for electrically connecting selected ones of the plurality of signal layers 16 and selected ones of the plurality of power/ground plane layers 18.

Figure 17:
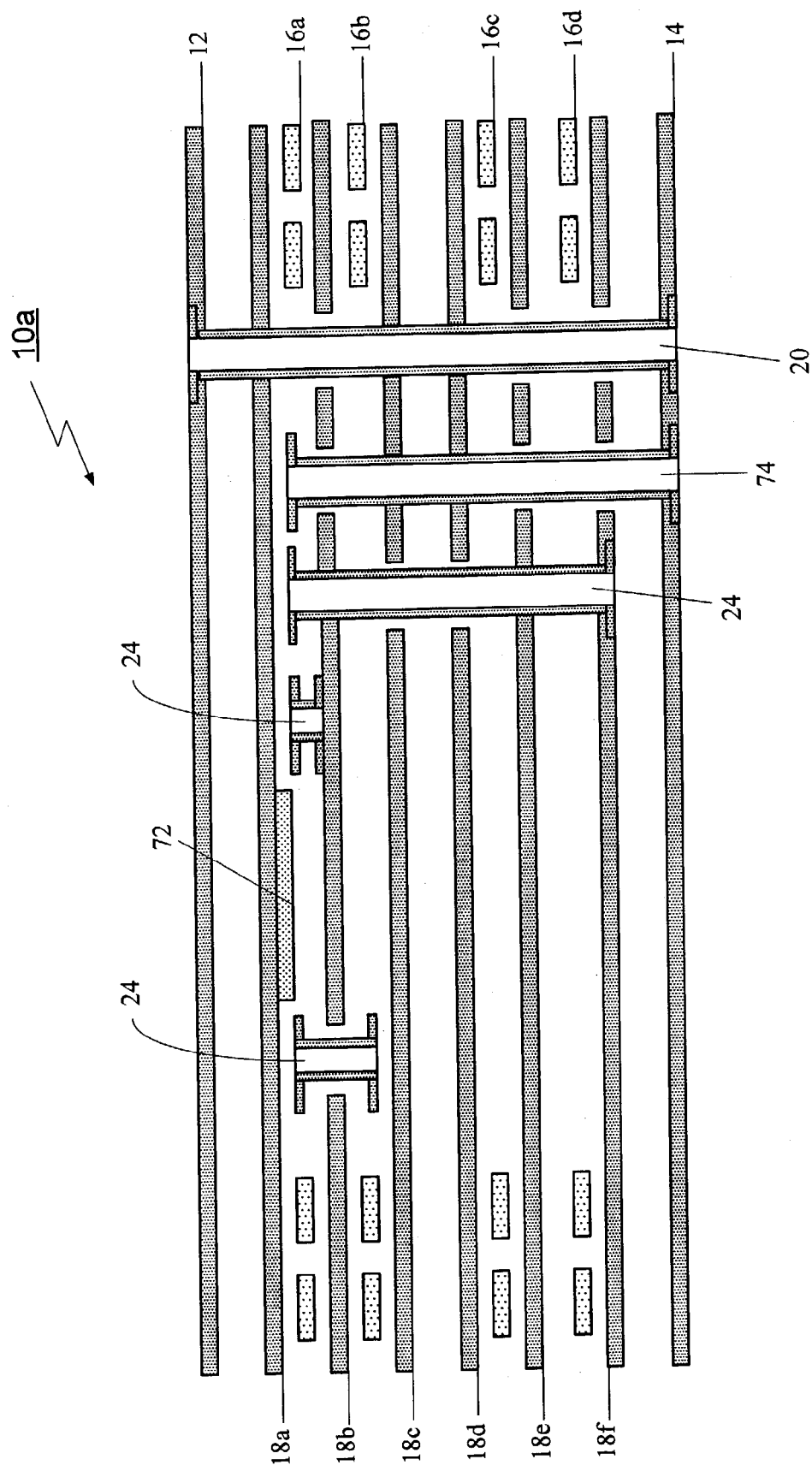
FIG. 17 is a side cross-sectional view of another multilayer printed circuit board in accordance with the present invention.

Differing from the multilayer printed circuit board 10 of FIG. 1, the multilayer printed circuit board 10a of FIG. 17 comprises a blind via 74 for electrically connecting the secondary layer 14, selected ones of the plurality of signal layers 16, and selected ones of the plurality of power/ground plane layers 18. The multilayer printed circuit board 10a also comprises an embedded electronic component 72 disposed between the power/ground plane layer 18a and the signal layer 16a.

Figure 18A:
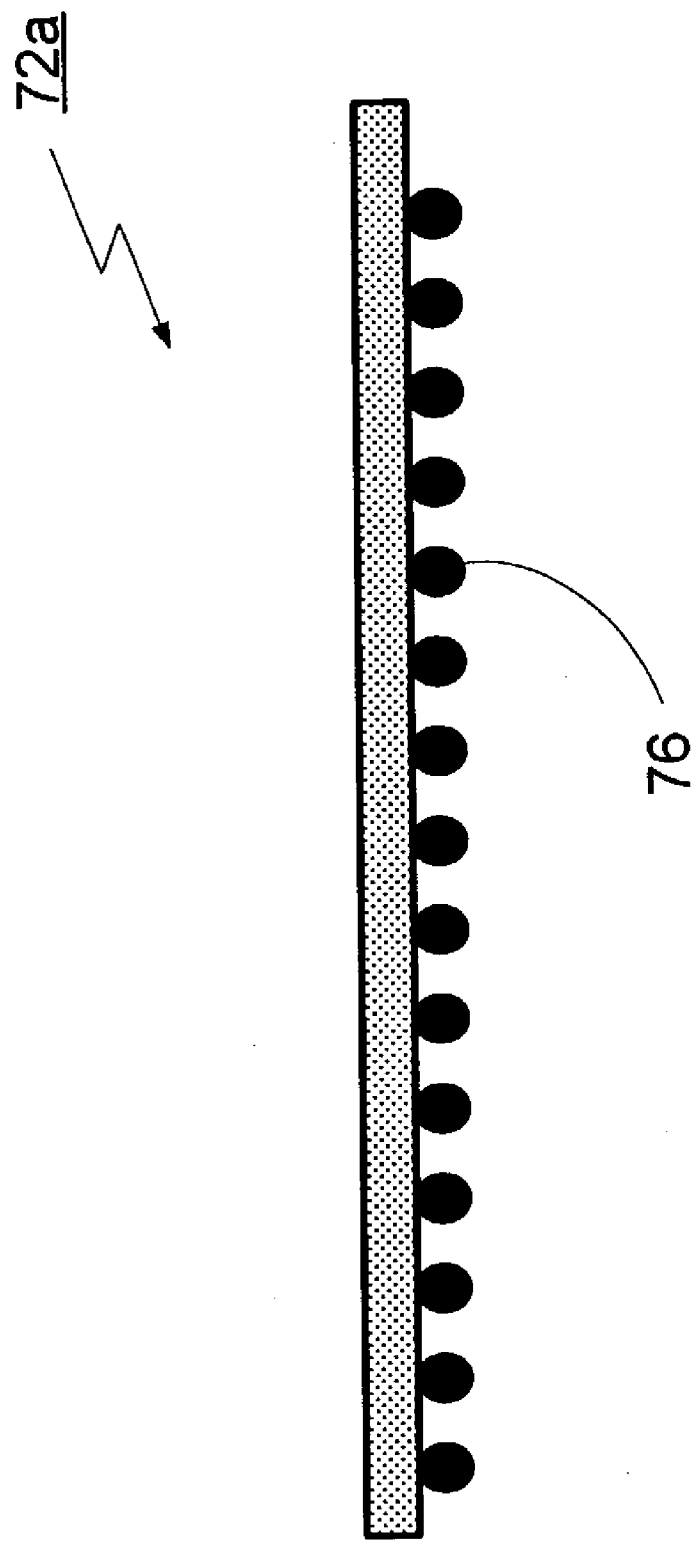
FIG. 18A shows an electronic component having electrically conductive contacts formed on one side thereof for electrically connecting to corresponding electrically conductive contacts formed on a layer of the multilayer printed circuit board shown in FIG. 17.
Figure 18B:
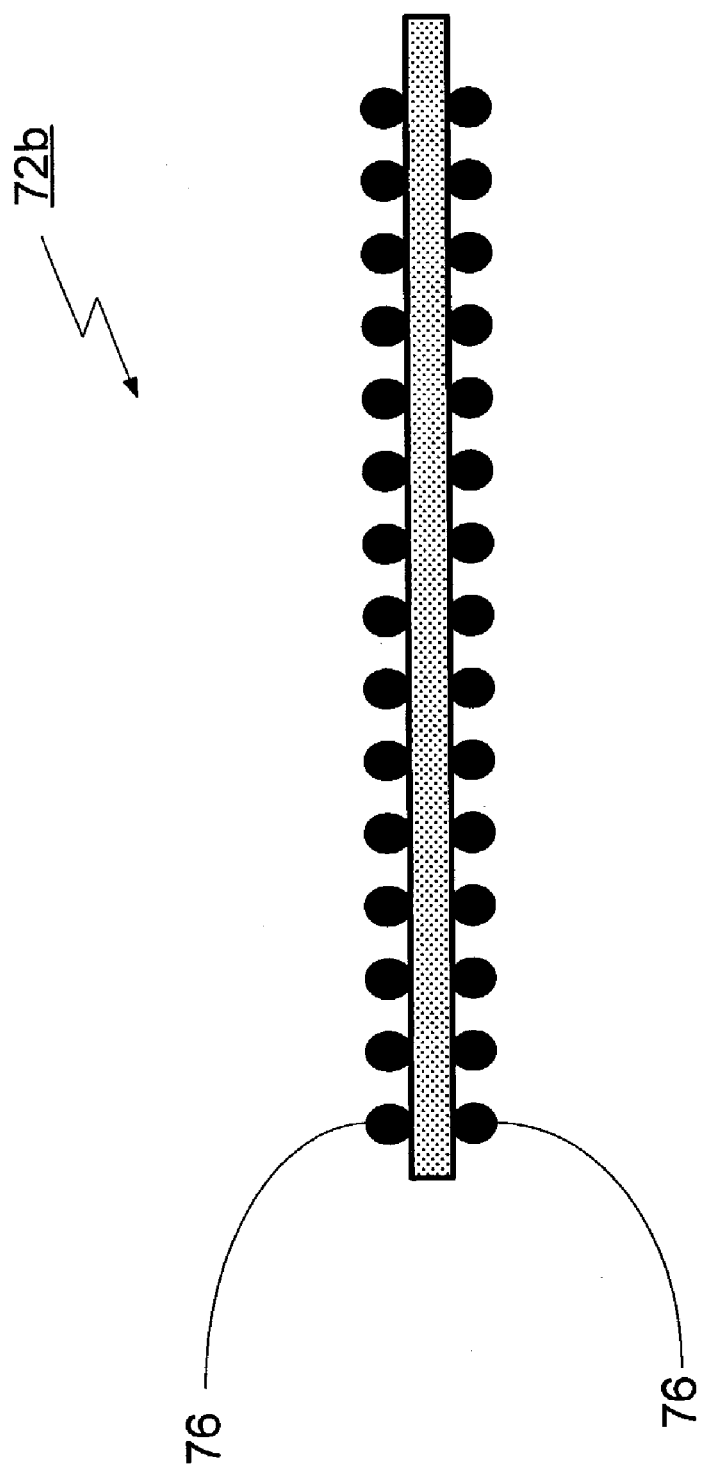
FIG. 18B shows an electronic component having electrically conductive contacts formed on multiple sides thereof for electrically connecting to corresponding electrically conductive contacts formed on multiple layers of the multilayer printed circuit board shown in FIG. 17.

As mentioned above, the embedded electronic component 72 may be one of a wide variety of possible electronic components. For example, referring to FIG. 18A, there is shown an electronic component 72a having electrically conductive contacts 76 formed on one side thereof. In this case, the electrically conductive contacts 76 may electrically connect to corresponding electrically conductive contacts formed on a selected one of the plurality of signal layers 16 (i.e., layer 16a in FIG. 17) or a selected one of the plurality of power/ground plane layers 18 (i.e., layer 18a in FIG. 17). Alternatively, referring to FIG. 18B, there is shown an electronic component 72b having electrically conductive contacts 76 formed on both sides thereof. In this case, the electrically conductive contacts 76 may electrically connect to corresponding electrically conductive contacts formed on a selected one of the plurality of signal layers 16 (i.e., layer 16a in FIG. 17) and a selected one of the plurality of power/ground plane layers 18 (i.e., layer 18a in FIG. 17). Of course, other types of electronic components (e.g., discrete components) may be embedded in the multilayer printed circuit board 10a of FIG. 17, and such embedded electronic components may be disposed between or on any of the plurality of signal layers 16 and/or any of the plurality of power/ground plane layers 18 in accordance with the present invention. In any case, the above-described techniques for reducing the number of layers in a multilayer printed circuit board may apply when such embedded electronic components are employed.

At this point it should be noted that, while the above detailed description has thus far been limited to reducing the number of layers in a multilayer printed circuit board, it is well within the scope of the present invention to apply the above-described techniques to a wide variety of multilayer signal routing devices. For example, the above-described techniques may be applied to multilayer integrated circuit die packaging devices. Thus, the present invention is more appropriately directed to techniques for reducing the number of layers in a multilayer signal routing device.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for reducing the number of layers in a multilayer signal routing device, the multilayer signal routing device having a plurality of electrically conductive signal path layers for routing electrical signals to and from at least one electronic component mounted on a surface of the multilayer signal routing device, the method comprising:

receiving electronic component information including an electrically conductive contact count characteristic, an electrically conductive contact pitch characteristic, an electrically conductive contact signal type characteristic, and an electrically conductive contact signal direction characteristic for at least one electronic component;

identifying an electronic component having a high density electrically conductive contact array package based at least in part upon at least one of the electrically conductive contact count characteristic and the electrically conductive contact pitch characteristic; and routing electrical signals on the plurality of electrically conductive signal path layers in the multilayer signal routing device for connection to and from the high density electrically conductive contact array package based at least in part upon at least one of the electrically conductive contact signal type characteristic and the electrically conductive contact signal direction characteristic.

2. The method of claim 1, further comprising:
forming a plurality of electrically conductive vias in the multilayer signal routing device extending from the surface of the multilayer signal routing device to one of the plurality of electrically conductive signal path layers, the plurality of electrically conductive vias being arranged so as to form a channel in another of the plurality of electrically conductive signal path layers beneath the plurality of electrically conductive vias.

3. The method of claim 2, wherein the channel is configured to have one or more of a linear, circular, diamond, curved, stepped, staggered, and random shape, or a combination thereof.

4. The method of claim 2, wherein the channel is configured to be in one or more of a vertical, horizontal, diagonal, and random direction, or a combination thereof.

5. The method of claim 2, wherein the plurality of electrically conductive vias form at least a portion of an electrically conductive contact array for mating with the high density electrically conductive contact array package of the electronic component, and wherein at least a portion of the plurality of electrically conductive vias are positioned inside the electrically conductive contact array such that the channel is correspondingly formed inside the electrically conductive contact array.

6. The method of claim 2, wherein the multilayer signal routing device has an array of electrically conductive contacts formed on the surface thereof for mating with the high density electrically conductive contact array package of the electronic component, wherein at least a portion of the plurality of electrically conductive vias are formed outside the array of electrically conductive contacts, wherein each of the portion of the plurality of electrically conductive vias is electrically connected to peripheral ones of the electrically conductive contacts on the surface the multilayer signal routing device.

7. The method of claim 2, wherein the plurality of electrically conductive vias further extend from the surface of the multilayer signal routing device to different ones of the plurality of electrically conductive signal path layers.

8. The method of claim 2, wherein the plurality of electrically conductive vias form at least a portion of an electrically conductive contact array for mating with the high density electrically conductive contact array package of the electronic component, and wherein at least a portion of the plurality of electrically conductive vias are positioned within the electrically conductive contact array such that the channel extends across the electrically conductive contact array.

9. The method of claim 2, wherein the plurality of electrically conductive vias form at least a portion of an electrically conductive contact array for mating with the high density electrically conductive contact array package of the electronic component, wherein the electrically conductive contact array has one or more of a square, triangular, circular, and random electrically conductive contact pattern, or a combination thereof.

10. The method of claim 2, wherein at least two of the electrical signals are differential electrical signals, wherein the differential electrical signals are at least partially routed together in the channel formed in another of the plurality of electrically conductive signal path layers beneath the plurality of electrically conductive vias.

11. The method of claim 1, wherein the multilayer signal routing device has at least one electrically conductive power layer for providing power to the electronic component mounted on the surface of the multilayer signal routing device, the method further comprising:
forming a plurality of electrically conductive vias in the multilayer signal routing device extending from the surface of the multilayer signal routing device to at least one of the at least one electrically conductive power layer, each of the plurality of electrically conductive vias being electrically connected to at least one respective electrically conductive power contact on the surface of the multilayer signal routing device, each of the at least one electrically conductive power contact forming a portion of an electrically conductive contact array for mating with the high density electrically conductive contact array package of the electronic component;
wherein a channel is formed in each of the plurality of electrically conductive signal path layers beneath the electrically conductive power contacts.

12. The method of claim 11, wherein the channel is configured to have one or more of a linear, circular, diamond, curved, stepped, staggered, and random shape, or a combination thereof.

13. The method of claim 11, wherein the channel is configured to be in one or more of a vertical, horizontal, diagonal, and random direction, or a combination thereof.

14. The method of claim 11, wherein at least a portion of the electrically conductive power contacts are positioned inside the electrically conductive contact array such that the channel is correspondingly formed inside the electrically conductive contact array.

15. The method of claim 11, wherein at least a portion of the plurality of electrically conductive vias are formed outside the array of electrically conductive contacts, wherein each of the portion of the plurality of electrically conductive vias is electrically connected to at least one respective electrically conductive power contact that is located on the periphery of the array of electrically conductive contacts.

16. The method of claim 11, wherein at least a portion of the electrically conductive power contacts are positioned within the electrically conductive contact array such that the channel extends across the electrically conductive contact array.

17. The method of claim 11, wherein the electrically conductive contact array has one or more of a square, triangular, circular, and random electrically conductive contact pattern, or a combination thereof.

18. The method of claim 11, wherein at least two of the electrical signals are differential electrical signals, wherein the differential electrical signals are at least partially routed together in the channel formed in one of the plurality of electrically conductive signal path layers beneath the electrically conductive power contacts.

19. The method of claim 1, wherein the multilayer signal routing device has at least one electrically conductive ground layer for providing a ground reference to the electronic component mounted on the surface of the multilayer signal routing device, the method further comprising:
forming a plurality of electrically conductive vias in the multilayer signal routing device extending from the surface of the multilayer signal routing device to at least one of the at least one electrically conductive ground layer, each of the plurality of electrically conductive vias being electrically connected to at least one respective electrically conductive ground contact on the surface of the multilayer signal routing device, each of the at least one electrically conductive ground contact forming a portion of an electrically conductive contact array for mating with the high density electrically conductive contact array package of the electronic component;

wherein a channel is formed in each of the plurality of electrically conductive signal path layers beneath the electrically conductive ground contacts.

20. The method of claim 19, wherein the channel is configured to have one or more of a linear, circular, diamond, curved, stepped, staggered, and random shape, or a combination thereof.

21. The method of claim 19, wherein the channel is configured to be in one or more of a vertical, horizontal, diagonal, and random direction, or a combination thereof.

22. The method of claim 19, wherein at least a portion of the electrically conductive ground contacts are positioned inside the electrically conductive contact array such that the channel is correspondingly formed inside the electrically conductive contact array.

23. The method of claim 19, wherein at least a portion of the plurality of electrically conductive vias are formed outside the array of electrically conductive contacts, wherein each of the portion of the plurality of electrically conductive vias is electrically connected to at least one respective electrically conductive ground contact that is located on the periphery of the array of electrically conductive contacts.

24. The method of claim 19, wherein at least a portion of the electrically conductive ground contacts are positioned within the electrically conductive contact array such that the channel extends across the electrically conductive contact array.

25. The method of claim 19, wherein the electrically conductive contact array has one or more of a square, triangular, circular, and random electrically conductive contact pattern, or a combination thereof.

26. The method of claim 19, wherein at least two of the electrical signals are differential electrical signals, wherein the differential electrical signals are at least partially routed together in the channel formed in one of the plurality of electrically conductive signal path layers beneath the electrically conductive ground contacts.

27. The method of claim 1, wherein the multilayer signal routing device has at least one electrically conductive shared power/ground layer for providing power/ground to the electronic component mounted on the surface of the multilayer signal routing device, the method further comprising:

forming a plurality of electrically conductive vias in the multilayer signal routing device extending from the surface of the multilayer signal routing device to at least one of the at least one electrically conductive shared power/ground layer, each of the plurality of electrically conductive vias being electrically connected to at least one respective electrically conductive power/ground contact on the surface of the multilayer signal routing device, each of the at least one electrically conductive power/ground contact forming at least a portion of an electrically conductive contact array for mating with the high density electrically conductive contact array package of the electronic component;

wherein a channel is formed in each of the plurality of electrically conductive signal path layers beneath each of the at least one electrically conductive power/ground contact.

28. The method of claim 1, wherein the surface of the multilayer signal routing device is an inner surface of the multilayer signal routing device, and the at least one electronic component is mounted on the inner surface of the multilayer signal routing device.

29. The method of claim 28, wherein the at least one electronic component has at least one first electrically conductive contact formed on a first side thereof, wherein the at least one first electrically conductive contact is electrically connected to at least one first corresponding electrically conductive contact formed on the inner surface of the multilayer signal routing device.

30. The method of claim 29, wherein the at least one electronic component has at least one second electrically conductive contact formed on a second side thereof, wherein the at least one second electrically conductive contact is electrically connected to at least one second corresponding electrically conductive contact formed on another inner surface of the multilayer signal routing device.

* * * * *